United States Patent
Eisele et al.

(10) Patent No.: US 11,467,115 B2
(45) Date of Patent: Oct. 11, 2022

(54) FLUID SENSOR

(71) Applicant: Fraunhofer-Gesellschaft zur Förderung der angewandten Forschung e.V., Munich (DE)

(72) Inventors: Ignaz Eisele, Icking (DE); Karl Neumeier, Taufkirchen (DE); Martin Heigl, Weiden (DE); Daniel Reiser, Munich (DE)

(73) Assignee: Fraunhofer-Gesellschaft zur Förderung der angewandten Forschung e.V., Munich (DE)

( * ) Notice: Subject to any disclaimer, the term of this patent is extended or adjusted under 35 U.S.C. 154(b) by 357 days.

(21) Appl. No.: 16/831,624

(22) Filed: Mar. 26, 2020

(65) Prior Publication Data

US 2020/0225183 A1 Jul. 16, 2020

Related U.S. Application Data

(63) Continuation of application No. PCT/EP2018/076189, filed on Sep. 26, 2018.

(30) Foreign Application Priority Data

Sep. 27, 2017 (DE) .................... 10 2017 217 249.5

(51) Int. Cl.
*G01N 27/22* (2006.01)
(52) U.S. Cl.
CPC ......... *G01N 27/226* (2013.01); *G01N 27/221* (2013.01); *G01N 27/227* (2013.01)
(58) Field of Classification Search
CPC ... G01N 27/226; G01N 27/221; G01N 27/227
See application file for complete search history.

(56) References Cited

U.S. PATENT DOCUMENTS 4,411,741 A * 10/1983 Janata ................ G01N 27/4141
257/253
4,935,207 A * 6/1990 Stanbro ................ G01N 27/227
422/69

(Continued)

FOREIGN PATENT DOCUMENTS

DE 4239319 A1 4/1993
DE 4333875 C2 8/1995

(Continued)

OTHER PUBLICATIONS

I. Lundström, M. S. Shivaraman, and C. Svensson, Hydrogen sensitive MOS structures. 1975 International Electron Devices Meeting, 21:631-634., 1975.

(Continued)

*Primary Examiner* — Alexander Satanovsky
*Assistant Examiner* — Sharah Zaab
(74) *Attorney, Agent, or Firm* — Perkins Coie LLP; Michael A. Glenn

(57) ABSTRACT

According to a further embodiment, a fluid sensor includes a fluid sensor element with a substrate including a recess for receiving a fluid to be examined, wherein the substrate surrounding the recess is formed, at least in parts, as a substrate electrode, an isolation layer arrangement between a floating gate electrode of a transistor and the substrate electrode and a sensor layer in the recess and adjacent to the floating gate electrode, an additional electrode at an opening area of the recess, wherein the additional electrode is arranged electrically isolated from the sensor layer, the substrate electrode and the floating gate electrode and is connected or connectable to a control potential and a processor configured to provide the control potential at the additional electrode such that an electric field between the (Continued)

additional electrode and the sensor layer is at least reduced or compensated during operation of the fluid sensor.

37 Claims, 8 Drawing Sheets

(56) References Cited

U.S. PATENT DOCUMENTS

| | | | |
|---|---|---|---|
| 5,646,438 | A | 7/1997 | Frerichs |
| 5,747,839 | A * | 5/1998 | Hammond ............ G01N 27/414 257/253 |
| 9,716,140 | B2 | 7/2017 | Eisele |
| 2006/0278528 | A1 | 12/2006 | Fleischer et al. |
| 2015/0287781 | A1 * | 10/2015 | Eisele ................. G01N 27/414 257/253 |
| 2015/0316503 | A1 * | 11/2015 | Hoque .................. H01L 29/788 257/253 |
| 2016/0225779 | A1 * | 8/2016 | Harada ............... H01L 29/7833 |
| 2016/0265047 | A1 * | 9/2016 | Van Rooyen ....... H01L 29/1606 |
| 2017/0067849 | A1 | 3/2017 | Cobianu et al. |

FOREIGN PATENT DOCUMENTS

| | | |
|---|---|---|
| DE | 102005033226 A1 | 1/2007 |
| DE | 102015104419 A1 | 10/2015 |
| EP | 0712137 A2 | 5/1996 |
| EP | 1715333 A2 | 10/2006 |
| EP | 2034302 A2 | 3/2009 |
| WO | 03050526 A2 | 6/2003 |
| WO | WO03050526 * | 6/2003 |
| WO | 2007009948 A1 | 1/2007 |

OTHER PUBLICATIONS

I. Lundström, S. Shivaraman, C. Svensson, and L. Lundkvist, A hydrogen-sensitive MOS field-effect transistor. Applied Physics Letters, 26(2):55-57., 1975.

I. Lundström, Hydrogen sensitive mos-structures: Part 1: Principles and applications Sensors and Actuators, 1:403-426., 1981.

I. Eisele, T. Doll, and M. Burgmair. Low power gas detection with FET sensors. Sensors and Actuators B: Chemical, 78(1):19-25., 2001.

K. Schamagl, M. Eriksson, A. Karthigeyan, M. Burgmair, M. Zimmer, and I. Eisele, Hydrogen detection at high concentrations with stabilised palladium. Sensors and Actuators B: Chemical, 78(1):138-143., 2001.

M. Heigl, K. Neumeier, G. Spitzlsperger, C. Kutter, and I. Eisele, Charge sensitive fluid sensor for chemical and biological applications. 2017 19th International Conference on Solid-State Sensors, Actuators and Microsystems (Transducers)., 2017.

Bergveld, P., "Development of an Ion-Sensitive Solid-State Device for Neurophysiological Measurements", IEEE Transactions on Biomedical Engineering, BME-17(1):70-71, 1970, 1970, pp. 70-71.

Bergveld, P., "What happened in the past 30 years and what may happen in the next 30 years", Sensors and Actuators B: Chemical, 88(1):1-20, 2003., 2003, pp. 1-20.

Burgmair, M., et al., "Field effect transducers for work function gas measurements: Device improvements and comparison of performance", Sensors and Actuators B: Chemical, 95(1):183-188, 2003., 2003, pp. 183-188.

Fung, Clifford D, et al., "A Generalized Theory of an Electrolyte-Insulator-Semiconductor Field-Effect Transistor", IEEE Transactions on Electron Devices, ED-33(1):8-18, 1986, 1986, pp. 8-18.

Korotcenkov, G., "Chemical Sensors", Comprehensive Sensor Technologies, vol. 4: Solid-State Devices. Momentum Press, 2011, 2011, 6 pp.

Nernst, Walther, "[Part 1 of 2] Die elektromotorische Wirksamkeit der Jonen", Zeitschrift für Physikalische Chemie, 4:129-181, 1889, 1889, pp. 129-181.

Nernst, Walther, "[Part 2 of 2] Die elektromotorische Wirksamkeit der Jonen", Zeitschrift für Physikalische Chemie, 4:129-181, 1889, 1889, pp. 129-181.

Simonis, Anette, "Untersuchungen zur Entwicklung einer feldeffektbasierten Biosensoranordnung mit integriertem Referenzsystem. Dissertation", Rheinisch-Westfälische Technische Hochschule, Aachen, 2006, 2006, 167 pp.

Van Den Berg, A., et al., "Sensitivity control of ISFETs by chemical surface modification", Sensors and Actuators, (2):129-148, 1985, 1985, pp. 129-148.

Van Der Pauw, L. J, "A Method of Measuring the Resistivity and Hall Coefficient on Lamellae and Arbitrary Shape", Philips Technical Review, 20(8):220-224, 1958/59, 1958, pp. 220-224.

Van Hal, R.E.G., et al., "A general model to describe the electrostatic potential at electrolyte oxide interfaces", Advances in Colloid and Interface Science, 69:31-62, 1996, 1996, pp. 31-62.

World Health Organization, "Guidelines for Drinking-water Quality", World Health Organization, Geneva, fourth edition, 2011, 2011, 564 pp.

World Health Organization, "The World Health Report: Reducing Risks, Promoting Healthy Life", World Health Organization, Geneva, 2002, 2002, 230 pp.

World Health Organization, "WHO Air quality guidelines for particle matter, ozone, nitrogen dioxide and sulfur dioxide: Global update 2005: Summary of risk assessment", World Health Organization, Geneva, 2006, 2006, 22 pp.

T. Sulima, T. Knittel, G. Freitag, W. Widanarto, and I. Eisele. A GasFET for Chlorine Detection. IEEE Sensors, 2005.

Z. Gergintschew, P. Kornetzky, and D: Schipanski. The capacitively controlled field effect transistor (CCFET) as a new low power gas sensor. Sensors and Actuators B 35-36 (1996), pp. 285-289.

* cited by examiner cross-section sensor

FLUID SENSOR

CROSS-REFERENCE TO RELATED APPLICATIONS

This application is a continuation of copending International Application No. PCT/EP2018/076189, filed Sep. 26, 2018, which is incorporated herein by reference in its entirety, and additionally claims priority from German Application No. 10 2017 217 249.5, filed Sep. 27, 2017, which is also incorporated herein by reference in its entirety.

BACKGROUND OF THE INVENTION

Fluid sensors generating their measurement signal by a change of charge or potential are, for example, based on a CCFET (capacitively controlled field effect transistor), SGFET (suspended gate field effect transistor) or FGFET (floating gate field effect transistor). Here, the influenced charge is directly converted into a sensor signal as change of the FET drain current, however, this results in a relatively low sensitivity. Therefore, due to their structural low transistor transconductance, the fluid sensors have a relatively low sensitivity caused by the large electrode distance between suspended gate and channel region or floating gate. The drift behavior of these devices or fluid sensors is also insufficient, since different potentials are applied to the gate electrode and the channel region or the floating electrode. This results in an electric field, since it moves charges on the surface or in the volume such that an equipotential surface is gradually formed, which finally suppresses or corrupts the sensor signal or the sensor output signal of the fluid sensor.

SUMMARY

According to an embodiment, a fluid sensor may have: a fluid sensor element, having: a substrate including a recess for receiving a fluid to be examined, wherein the substrate surrounding the recess is formed, at least in parts, as a substrate electrode, an isolation layer arrangement between a floating gate electrode of a transistor and the substrate electrode and a sensor layer in the recess and adjacent to the floating gate electrode, an additional electrode at an opening area of the recess, wherein the additional electrode is arranged electrically isolated from the sensor layer, the substrate electrode and the floating gate electrode and is connected or connectable to a control potential and processing means configured to provide the control potential at the additional electrode such that an electric field between the additional electrode and the sensor layer is at least reduced or compensated during operation of the fluid sensor; and wherein the processing means is configured to set the control potential to a current sensor potential at the sensor layer, wherein the current sensor potential is effected as an electric change at the sensor layer by the fluid to be examined.

According to another embodiment, a fluid sensor may have: a fluid sensor element having: a substrate including a recess for receiving a fluid to be examined, wherein the substrate surrounding the recess is formed, at least in parts, as a substrate electrode, and wherein the substrate electrode at least partly surrounds the recess and is connected or connectable to a reference potential or regulation potential, an isolation layer arrangement between a floating gate electrode of a transistor and the substrate electrode, a sensor layer adjacent to the floating gate electrode in the recess, wherein the sensor layer, the floating gate electrode and the substrate electrode are arranged such that a first capacitance $C_{41}$ is formed between the substrate electrode and the floating gate electrode, and further a second capacitance $C_{46}$ is formed between the floating gate electrode and the sensor layer, wherein the first capacitance $C_{41}$ and the second capacitance $C_{46}$ form a capacitance ratio $K=C_{41}/C_{46}$ and processing means configured to hold the transistor at an operating point and to set the regulation potential at the substrate electrode during operation of the fluid sensor using the capacitance ratio K, such that the regulation potential at the substrate electrode is the value of the potential at the sensor layer increased by the capacitance ratio K, with $P_9=K*P_{11}$.

"Capacitive voltage divider": According to an embodiment, a fluid sensor 100 includes a fluid sensor element 20 having a substrate 1 comprising a recess 10 for receiving a fluid F to be examined, wherein the substrate surrounding the recess 10 is formed, at least in parts, as a substrate electrode 1, and wherein the substrate electrode 1 at least partly surrounds the recess 10 and is connected or connectable to a reference potential or regulation potential P9, an isolation layer arrangement 2 between a floating gate electrode 4 of a transistor 7 and the substrate electrode 1, a sensor layer 6 adjacent to the floating gate electrode 4 in the recess 10, wherein the sensor layer 6, the floating gate electrode 4 and the substrate electrode 1 are arranged such that a first capacitance $C_{41}$ is formed between the substrate electrode 1 and the floating gate electrode 4, and further a second capacitance $C_{46}$ is formed between the floating gate electrode 4 and the sensor layer 6, wherein the first capacitance $C_{41}$ and the second capacitance $C_{46}$ form a capacitance ratio $K=C_{41}/C_{46}$ and processing means 8 that is configured to hold the transistor 7 at an operating point and to set the regulation potential P9 at the substrate electrode 1 during operation of the fluid sensor using the capacitance ratio K, such that the regulation potential P9 at the substrate electrode 1 is the value of the potential 11 at the sensor layer 6 increased by the capacitance ratio K, with $P_9=K*P_{11}$.

The sensor layer can be isolated from the floating gate electrode of the transistor, such as an FGFET, by an isolator (=a further isolation layer arrangement). The only charge resulting at the sensor layer is caused by chemical and/or physical reactions or addition reactions of the fluid to be examined at the sensor layer. This charge influences a counter charge on the floating gate electrode that is connected to the gate terminal (control terminal), for example of an MOS transistor and can hence be detected. The gate electrode is isolated from the substrate comprising the recess by an isolator, the isolation layer arrangement between the gate electrode and the substrate electrode. If this substrate comprises, for example, a semiconductive or conductive material, the same will also form an electrode, i.e. the substrate electrode. Therefore, a capacitive voltage divider results between the sensor layer, the floating gate electrode and the substrate electrode.

According to the present concept, the drain current of the transistor is a measure for the potential of the floating gate electrode. If this drain current is kept constant by regulating the substrate electrode potential, the substrate potential compensates the potential of the sensor layer. If the capacitance between sensor layer and floating gate electrode is selected to be large, and the capacitance between floating gate electrode and substrate electrode is selected to be relatively small or very small, a significantly higher potential is needed on the substrate electrode to compensate the influence of the influenced charge from the sensor layer. Different capacitance ratios can be obtained by different layer thicknesses or different materials having different permittivities (=dielectric conductivities) for the first and second isolation layer arrangements. In that way, the capacitive voltage divider can be used for amplifying the sensor signal when the substrate electrode is regulated and the substrate electrode potential is used as sensor signal. If, for example, the first isolation layer arrangement between the substrate electrode and the floating gate electrode is selected to be ten times (or n times) thicker than the second isolation layer arrangement between the sensor layer and the floating gate electrode with the same permittivities of the isolator materials, a ten times or (n times) higher sensor output signal is obtained compared to the case when both isolation layers are configured in the same manner. Thus, for example, a value of 580 Mv per ΔpH can be obtained compared to a 58 Mv per ΔpH value as in common fluid sensors, such as pH sensors.

According to an embodiment, the fluid sensor element of the fluid sensor can further comprise an additional electrode at an opening area of the recess, wherein the additional electrode is arranged electrically isolated from the sensor layer, the substrate electrode and the floating gate electrode, and is connected or connectable to a control potential. The processing means is, for example, configured to provide the control potential at the additional electrode and/or the further additional electrode such that an electric field between the additional electrode and the sensor layer is at least reduced and compensated during operation of the fluid sensor.

According to an embodiment, the recess can be configured to be open on two sides, i.e. the substrate can be arranged continuously, wherein the additional electrode is arranged bordering on the opening area of the recess on the first side (the first main surface area) of the substrate, wherein the further additional electrode is arranged bordering on a further opening area of the recess on the second side (the second main surface area) of the substrate and is formed electrically isolated from the sensor layer, wherein the further additional electrode is further connected or connectable to the control potential. Thus, the processing means is further configured to set the control potential during operation such that the electric field between the additional electrode and the sensor layer is at least reduced or compensated, and further such that an electric field between the further additional electrode and the sensor layer is at least reduced or compensated.

According to an embodiment, the processing means is configured to calculate the control potential at the additional electrode and/or the further additional electrode based on the following formula (cup voltage formula):

$$P_8 = (P_4 - P_9)\frac{C_{41}}{C_{46}} + P_4 + P_{K\text{-}optional}, \text{ with } P_4 = \frac{I_D}{\beta \cdot V_{DS}} + V_T,$$

wherein "$P_{K\text{-}optional}$" is an optional correction potential, i.e. for optionally considering, for example, a constant offset quantity not detected by the processing means or regulation circuit 8, wherein the term $$\beta = \mu \cdot \frac{W}{L} \cdot \frac{\varepsilon_{ox}}{d_{ox}}$$

is the transconductance of the transistor and
wherein VT is the threshold voltage of the transistor
wherein µ is the mobility of the charge carriers,
wherein W is the width and L the length of the transistor channel,
wherein $\varepsilon_{ox}$ is the permittivity of the gate oxide of the transistor and
wherein $d_{ox}$ is the thickness of the gate oxide of the transistor.

According to a further embodiment, the processing means can be configured to determine the control potential based on the sensor potential at the sensor layer and to determine the sensor potential at the sensor layer in the recess based on a reference sensor element. Otherwise, the fluid sensor element and the reference sensor element comprising a sensor substitute layer instead of the sensor layer of the fluid sensor element have the same structure.

The processing means is further configured to hold the transistor and the further transistor at the same operating point, such that, at the conductive sensor substitute layer of the reference sensor element, the same sensor potential settles as at the sensor layer of the fluid sensor element. The processing means is further configured to provide the sensor potential applied to the conductive sensor substitute layer or a potential derived therefrom, for example provided with an offset ΔU, as the control potential for the additional electrode and/or a further additional electrode.

"Additional electrode": According to a further embodiment, a fluid sensor 100 comprises a fluid sensor element 20 with a substrate 1' comprising a recess 10 for receiving a fluid to be examined, wherein the substrate 1' surrounding the recess 10 is formed, at least in parts, as a substrate electrode 1, an isolation layer arrangement 2 between a floating gate electrode 4 of a transistor 7 (FET) and the substrate electrode 1, and a sensor layer 6 in the recess 10 and adjacent to the floating gate electrode 4, an additional electrode 3 at an opening area 10-1 of the recess 10, wherein the additional electrode 3 is arranged electrically isolated from the sensor layer 6, the substrate electrode 1 and the floating gate electrode 4 and connected or connectable to a control potential P8 and processing means 8 configured to provide the control potential P8 at the additional electrode 3 such that an electric field between the additional electrode 3 and the sensor layer 6 is at least reduced or compensated during operation of the fluid sensor 100.

According to a further embodiment, the fluid sensor can obtain a very low drift behavior and high sensitivity by effectively suppressing the drift or the drift behavior of the fluid sensor. This suppression of the drift is obtained by adapting the structure of the fluid sensor element such that no electric field occurs between the sensor layer and the edge area of the fluid sensor element or the edge area of the recess arranged in the substrate. This state can be obtained by an additional electrode at the opening area of the recess, wherein the additional electrode is held on the essentially same potential as the sensor layer by a suitable control apparatus or processing means. Thereby, a change of charge of the sensor layer is prevented and the drift is suppressed. Since the recess represents a field-free space, the same is also insensitive to charges in the volume.

An essentially electrically field-free space is generated in the recess where the fluid sensor element is located as well, even when equally distributed charges are provided inside this recess. The substrate electrode can form, for example, some sort of Faraday cage with respect to the recess. Thereby, a drift caused by charges in the volume can be excluded. Further, the provided additional electrode can prevent that an electric field results at the edge area or the edge of the recess, which continues to attract charges and would hence cause a drift. Therefore, by providing the additional electrode, the structural transistor transconductance can be significantly increased.

In this embodiment, the "capacitive voltage divider" can also be applied by selecting the capacitance between sensor layer and floating gate electrode to be relatively large and selecting the capacitance between floating gate electrode and substrate electrode to be relatively small. In that way, a significantly higher potential is needed on the substrate electrode in order to compensate the influence of the influenced charge from the sensor layer. Different capacitance ratios can again be obtained by different layer thicknesses or different materials having different permittivities for the first and second isolation layer arrangements. In that way, the capacitive voltage divider can be used for amplifying the sensor signal when the substrate electrode is regulated and the substrate electrode potential is used as sensor signal.

According to a further embodiment, the fluid sensor element of the fluid sensor is formed in a recess that is configured to be open on two sides or to be passing through the substrate. The additional electrode is arranged bordering on the opening area of the recess on the first side of the substrate and electrically isolated from the sensor layer and connected or connectable to the control potential. Further, a further additional electrode is arranged bordering on a further opening area of the recess on the second side of the substrate and electrically isolated from the sensor layer and connected or connectable to the control potential. The processing means is further configured to set the control potential during operation such that the electric field between the additional electrode and the sensor layer is at least reduced or compensated and such that an electric field between the further additional electrode and the sensor layer is at least reduced or compensated.

According to an embodiment, the processing means is configured to determine or to calculate the control potential for the additional electrode or a further additional electrode based on the regulation potential at the substrate electrode based on the following formula:

$$P_8 = (P_4 - P_9)\frac{C_{41}}{C_{46}} + P_4 + P_{K-optional}, \text{ with } P_4 = \frac{I_D}{\beta \cdot V_{DS}} + V_T.$$

According to a further embodiment, the processing means is configured to determine the control potential based on the sensor potential at the sensor layer and to determine the sensor potential at the sensor layer in the recess based on a reference sensor element. Otherwise, the fluid sensor element and the reference sensor element comprising a conductive sensor substitute layer instead of the sensor layer of the fluid sensor element have the same structure.

The processing means is further configured to hold the transistor of the fluid sensor element and the further transistor of the reference sensor element at the same operating point, such that the same sensor potential as at the sensor layer of the fluid sensor element settles at the conductive sensor substitute layer of the reference sensor element, wherein the processing means is further configured to provide the sensor potential or a potential derived therefrom, for example provided with an offset ΔU, as the control potential for the additional electrode or the further additional electrode.

BRIEF DESCRIPTION OF THE DRAWINGS

Embodiments of the present invention will be detailed subsequently referring to the appended drawings, in which.

DETAILED DESCRIPTION OF THE INVENTION

Figure 1:
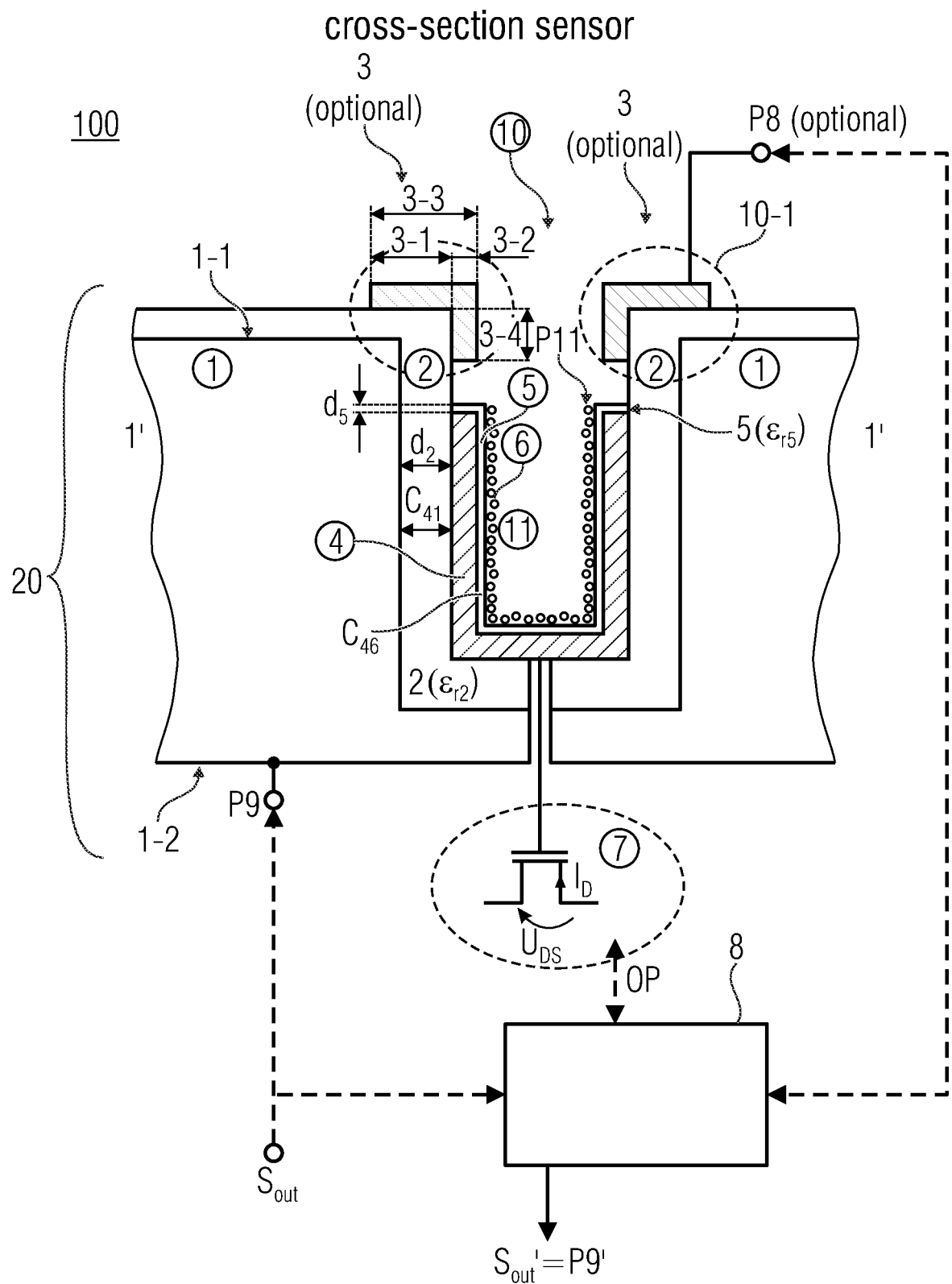
FIG. 1 is a basic schematic cross-sectional illustration of a fluid sensor element with the associated processing means of a fluid sensor according to an embodiment.

Before embodiments of the present invention will be discussed in more detail below based on the drawings, it should be noted that identical, functionally equal or equal elements, objects, functional blocks and/or method steps in the different figures are provided with the same reference numbers such that the description of these elements, objects, functional blocks and/or method steps (with the same reference numbers) illustrated in different embodiments is inter-exchangeable or inter-applicable.

Different embodiments will be describes in detail with reference to the accompanying drawings, where some embodiments are illustrated. In the figures, dimensions of layers and/or areas might not be to scale for illustrating purposes.

When an element is referred to as "connected" or "coupled" to another element, it is obvious that the same can be connected or coupled directly to the other element or intermediate elements can be provided. When, in contrary, an element is referred to as "directly", "connected" or "coupled" to another element, no intermediate elements are provided. Other terms used for describing the relationship between elements are to be interpreted in a similar manner (e.g., "between" with respect to "directly between", "adjacent" compared to "directly adjacent", etc.).

In the following, based on the basic schematic cross-sectional illustration in FIG. 1, a fluid sensor element 20 and an associated processing means 8 of a fluid sensor 100 according to an embodiment will be described as "capacitive voltage divider".

According to an embodiment, the fluid sensor 100 comprises a fluid sensor element and processing means 8. The fluid sensor element 20 comprises a substrate 1' comprising a recess 10 for receiving a fluid F to be examined. The substrate 1' surrounding the recess 10 is formed, at least in parts, as substrate electrode 1. The substrate electrode 1 at least partly or also completely surrounds the recess 10 in the substrate, wherein the substrate electrode 1 is further connected or connectable to a reference potential or regulation potential $P_9$.

An isolation layer arrangement 2 is arranged between a floating gate electrode 4 of a transistor 7, e.g., an FET and the substrate electrode 1. The material of the isolation layer arrangement 2 has a thickness $d_2$ and a permittivity $\varepsilon_{r2}$.

A sensor layer 6, for example configured as a chemically sensitive layer, is arranged adjacent to the floating gate electrode 4 of the transistor 7 in the recess 10. A further isolation layer arrangement 5 can be arranged, for example, between the sensor layer 6 and the floating gate electrode 4. The material of the isolation layer arrangement 5 has a thickness $d_5$ and a permittivity $\varepsilon_{r5}$. As illustrated in FIG. 1, the sensor layer 6, the floating gate electrode 4 and the substrate electrode 1 are arranged such that a first capacitance $C_{41}$ is formed between the substrate electrode 1 and the floating gate electrode 4 and further a second capacitance $C_{46}$ is formed between the floating gate electrode 4 and the sensor layer 6. Here, the first capacitance $C_{41}$ and the second capacitance $C_{46}$ form a capacitance ratio $K=C_{41}/C_{46}$.

If, for example, the first isolation layer arrangement 5 comprises a first material layer, e.g., $SiO_2$ with $\varepsilon_r=3.9$, and the sensor layer 6 comprises, for example, a second material layer, e.g., $Si_3N_4$ with $\varepsilon_r=7.5$, the layer thickness d5 can, for example be considered as combined effective layer thickness $d_5$ of the first and second material layers 5 and 6, e.g., the $SiO_2$ material layer 5 and the $Si_3N_4$ material layer 6, by considering the respective relative permittivity of the layer materials, such as $SiO_2$ and $Si_3N_4$.

Further, the fluid sensor 100 includes the processing means 8 configured to hold the transistor 7 at an operating point OP and to set the regulation potential P9 at the substrate electrode 1 during operation of the fluid sensor 100, for example using the capacitance ratio K such that the regulation potential P9 at the substrate electrode 1 is the value of the potential P11 at the sensor layer increased by the capacitance ratio K, i.e., with $P_9=K*P_{11}$. At its operating point OP, the transistor 7 comprises a drain source voltage $U_{DS}$ and a drain current $I_D$.

As illustrated in FIG. 1, starting from the processing means, dotted double arrows to further elements of the fluid sensor 10, i.e., for example, to the transistor 7 and the substrate electrode 1 are provided. These dotted double arrows indicate that the processing means 8 is connected to the respective element to detect a signal and/or a characteristic from the respective element and/or further to provide a signal, for example a control and/or regulation signal, to the respective element or to supply or control the respective element with a signal.

According to an embodiment, an operating current $I_D$ and an operating voltage $U_{DS}$ of the transistor 7 are predetermined at the operating point OP of the transistor 7. A unique gate source potential $U_{GS}$ at the floating gate electrode 4 of the transistor 7 is associated with these parameters, i.e., the operating current $I_D$ and the operating voltage $U_{DS}$ of the transistor 7.

The regulation potential P9 is proportional to the electric change P11 of the sensor layer 6 in the recess 1 caused by the fluid F to be examined, wherein the regulation potential P9 or also a signal P9' that is derived therefrom or rendered is the sensor output signal $S_{out}$ of the fluid sensor. If charges are formed at the sensor layer 6 due to the fluid F, i.e., a gas or gas mixture or liquid or liquid mixture in the recess 10, a respective change of potential ΔP11 results at the sensor layer 6 and further a respective change of the gate potential P4 at the floating gate electrode 4 of the transistor 7. The processing means or regulation circuit 8 is configured to change the potential P9 at the substrate electrode 1 to restore the original state or operating point OP. Thereby, the signal P11 of the sensor layer 6 amplified at the substrate electrode 1 by the capacitive voltage divider effect or the capacitance ratio K is available as potential P9 or the output signal $S_{OUT}$, wherein P11 is the sensor potential at the sensor layer 6.

According to an embodiment, the sensor layer 6, the floating gate electrode 4 and the substrate electrode 1 or the isolation layer arrangement 2 arranged between the substrate electrode 1 and the floating gate electrode 4 and the further isolation layer arrangement 5 arranged between the sensor layer 6 and the floating gate electrode 4 are arranged or set with respect to their thicknesses $d_2$, $d_5$ and/or permittivities $\varepsilon_{r2}$, $\varepsilon_{r5}$ such as to obtain a capacitance ratio $K=C_{41}/C_{46}$ with $K \geq 2$, 5, 8 or 10 (or higher).

The substrate electrode 1 can, for example, correspond to a delimited doped region (doping region with increased conductivity) of the substrate 1' adjacent to the recess 10. In one embodiment, the substrate electrode 1 can correspond to a delimited doping region of the substrate 1', e.g., a p or n doping of the substrate 1'. This delimited doping region 1 is, delimited, for example, from a bordering substrate region 1' by a pn junction, such that a desired potential can be applied to the delimited doping region.

The substrate electrode 1 can be formed, for example, by a respectively configured or formed conductor 1, e.g., by a metal or metal coating on the substrate 1'.

The chemically sensitive layer 6 is configured to convert, for example, chemical reactions, passage of ions, physical adsorption, chemical adsorption, change of dipole moments, etc., into electric changes, for example by changing the charge state or the dielectricity constant.

Thus, the sensor layer 6 can be isolated from the floating gate electrode 4 of the transistor 7 by the further isolation layer arrangement 5. The charge at the sensor layer 6 caused by chemical reactions or addition reactions of the fluid F to be examined at the sensor layer 6 influences a counter charge at the floating gate electrode 4 that is connected to the gate terminal (control terminal) of the transistor 7 and can hence be detected. By the isolation layer arrangement 2 between the gate electrode 4 and the substrate electrode 1, the gate electrode 4 is isolated from the substrate 1' in which the recess 10 is provided. If this substrate 1' comprises, for example, a semiconductive or conductive material, the same forms the substrate electrode 1. Thereby, a capacitive voltage divider results between the sensor layer 6, the floating gate electrode 4 and the substrate electrode 1.

According to the present concept, the drain current of the transistor 7 is a measure for the potential P4 of the floating gate electrode 4. If this drain current $I_D$ is kept constant by regulating the substrate electrode potential P9, the substrate potential P9 compensates the potential P6 of the sensor layer 6. If the capacitance $C_{46}$ between sensor layer 6 and floating gate electrode 4 is selected to be relatively large and the capacitance $C_{41}$ between floating gate electrode 4 and substrate electrode 1 is selected to be relatively small, a significantly higher potential P9 is needed at the substrate electrode 1 to compensate the influence of the influenced charge from the sensor layer 6. Different capacitance ratios can be obtained by different layer thicknesses $d_2$, $d_5$ or different materials with different permittivities $\varepsilon_{r2}$, $\varepsilon_{r5}$ (=dielectric conductivities) for the first and second isolation layer arrangements 2, 5.

In that way, the capacitive voltage divider with $C_{41}$ and $C_{46}$ can be used for amplifying the sensor signal $S_{out}$ when the substrate electrode 1 is regulated and the substrate electrode potential P9 is used as sensor signal $S_{OUT}$. If, for example, the isolation layer arrangement 2 between the substrate electrode 1 and the floating gate electrode 4 is selected to be n times as thick as the second isolation layer arrangement 5 between the sensor layer 6 and the floating gate electrode 4 with the same permittivities $\varepsilon_{r2}$, $\varepsilon_{r5}$ of the isolator materials, an n time higher sensor output signal $S_{OUT}$ is obtained compared to the case when both isolation layers are configured to have the same thickness.

According to an embodiment, the fluid sensor element 20 of the fluid sensor 100 can further optionally comprise an additional electrode 3 at an opening region 10-1 of the recess 10, wherein the optional additional electrode 3 is arranged electrically isolated from the sensor layer 6, the substrate electrode 1 and the floating gate electrode 4 and connected or connectable to a control potential P8. Further, optionally, the processing means 8 can be configured to provide the optional control potential P8 at the optional additional electrode 3 such that an electric field E between the additional electrode 3 and the sensor layer 6 is at least reduced or compensated during operation of the fluid sensor 100. Further, the processing means 8 can optionally be configured to set the control potential P8 to a current sensor potential P11 at the sensor layer 6, wherein the current sensor potential P11 is effected, by the fluid F to be examined, as electric change or change of charge ΔP11 at the sensor layer 6.

According to an embodiment, the optional additional electrode 3 can be configured adjacent to the opening area 10-1 of the recess 10 bordering on the top main surface area 1-1 of the substrate 1' as a disc-shaped outer ring 3-1 and/or 3-3, within the recess 10 as circumferential inner ring 3-4 at the wall area of the recess 10 or as an L-shaped combination of the disc-shaped outer ring 3-3 and the inner ring 3-4.

According to an embodiment, the recess 10 can be configured in the form of a trench, for example a hollow cylindrical passage, a cup or a gap in the substrate 1', wherein the recess 10 at the opening area 10-1 extends from a first surface area 1-1 of the substrate 1' into the substrate 1'.

According to an embodiment, the sensor layer 6, the floating gate electrode 4 and the substrate electrode 1 are arranged such that the first capacitance $C_{41}$ is formed between the substrate electrode 1 and the floating gate electrode 4, and further the second capacitance $C_{46}$ is formed between the floating gate electrode 4 and the sensor layer 6, wherein the substrate electrode 1 of the fluid sensor element at least partly surrounds the recess 10 and is connected or connectable to the regulation potential P9.

Further, the processing means 8 is configured to hold the transistor 7 at an operating point and to set the regulation potential P9 at the substrate electrode 1 "during operation" of the fluid sensor using the capacitance ratio $K=C_{41}/C_{46}$ such that the regulation potential P9 at the substrate electrode 1 is the value of the sensor potential P11 at the sensor layer 6 increased by the capacitance ratio K, with $P_9=K*P_{11}$, and wherein the processing means 8 is further configured to determine the control potential P8 for the additional electrode based on the regulation potential P9.

The processing means 8 is configured, for example, to calculate the control potential P8 within a tolerance range based on the following formula:

$$P_8 = (P_4 - P_9)\frac{C_{41}}{C_{46}} + P_4 + P_{K-optional}, \text{ with } P_4 = \frac{I_D}{\beta \cdot V_{DS}} + V_T,$$

wherein $P_{K-optional}$ is an optional correction potential, i.e., for optional consideration of, for example, a constant offset quantity which is not detected by the processing means or regulation circuit 8, $$\beta = \mu \cdot \frac{w}{L} \cdot \frac{\varepsilon_{ox}}{d_{ox}}$$

wherein the term is the transconductance of the transistor and wherein $V_T$ is the threshold voltage of the transistor,
wherein μ is the mobility of the charge carriers,
wherein W is the width and L the length of the transistor channel,
wherein $\varepsilon_{ox}$ is the permittivity of the gate oxide of the transistor and wherein $d_{ox}$ is the thickness of the gate oxide of the transistor.

According to a further embodiment, the processing means 8 can be configured to determine the control potential P9 based on the sensor potential P11 at the sensor layer 6 and to determine the sensor potential P11 of the sensor layer 6 in the recess 10 based on a reference sensor element 20A (not shown in FIG. 1). Regarding the reference sensor element 20A, reference is made to the subsequent description in the context of FIGS. 6 and 7, which can be equally applied here. Otherwise, the fluid sensor element 20 and the reference sensor element 20A (not shown in FIG. 1, see FIG. 6) comprising a conductive sensor substitute layer instead of the sensor layer 6 of the fluid sensor element 20 have the same structure.

According to an embodiment, the processing means 8 is further configured to hold the transistor 7 and the further transistor 7a at the same operating point, such that the same sensor potential P11 as at the sensor layer 6 of the fluid sensor element 20 settles at the conductive sensor substitute layer 6a of the reference sensor element 20a.

At its operating point OP1, the transistor 7 comprises the drain source voltage $U_{DS1}$ and the drain current $I_{D1}$, and the further transistor 7a comprises the drain source voltage $U_{DS2}$ and the drain current $I_{D2}$ at its operating point OP2, wherein for the same operating points OP1 and OP2 of the transistors 7 and the further transistors 7a, essentially, the following applies:

$OP1=OP2$ with $U_{DS1}=U_{DS2}$ and $I_{D1}=I_{D2}$

The processing means 8 is now further configured to provide the sensor potential P11 applied to the conductive sensor substitute layer 6a or a potential P11' derived therefrom, e.g., $P11'=P11+P_{K-optional}$ or with an offset ΔU, as the control potential P8 for the additional electrode 3. Further, the processing means 8 can be configured to provide the control potential P8 for the additional electrode 3 with an optional correction potential $P_{K-optional}$ in order to consider, for example, a constant offset quantity not detected by the processing means or regulation circuit 8. Thus, the regulation potential P9 is proportional to the electric change P11 of the sensor layer 6 in the recess 10 caused by the fluid F to be examined, wherein the regulation potential P9 or a signal P9 that is derived therefrom or rendered is the sensor output signal $S_{OUT}$ of the fluid sensor 100.

In the following, based on FIG. 2, a schematic basic circuit-technology illustration of the processing means 8 or part of the processing means 8 of the fluid sensor 100 according to an embodiment will be described.

Figure 2:
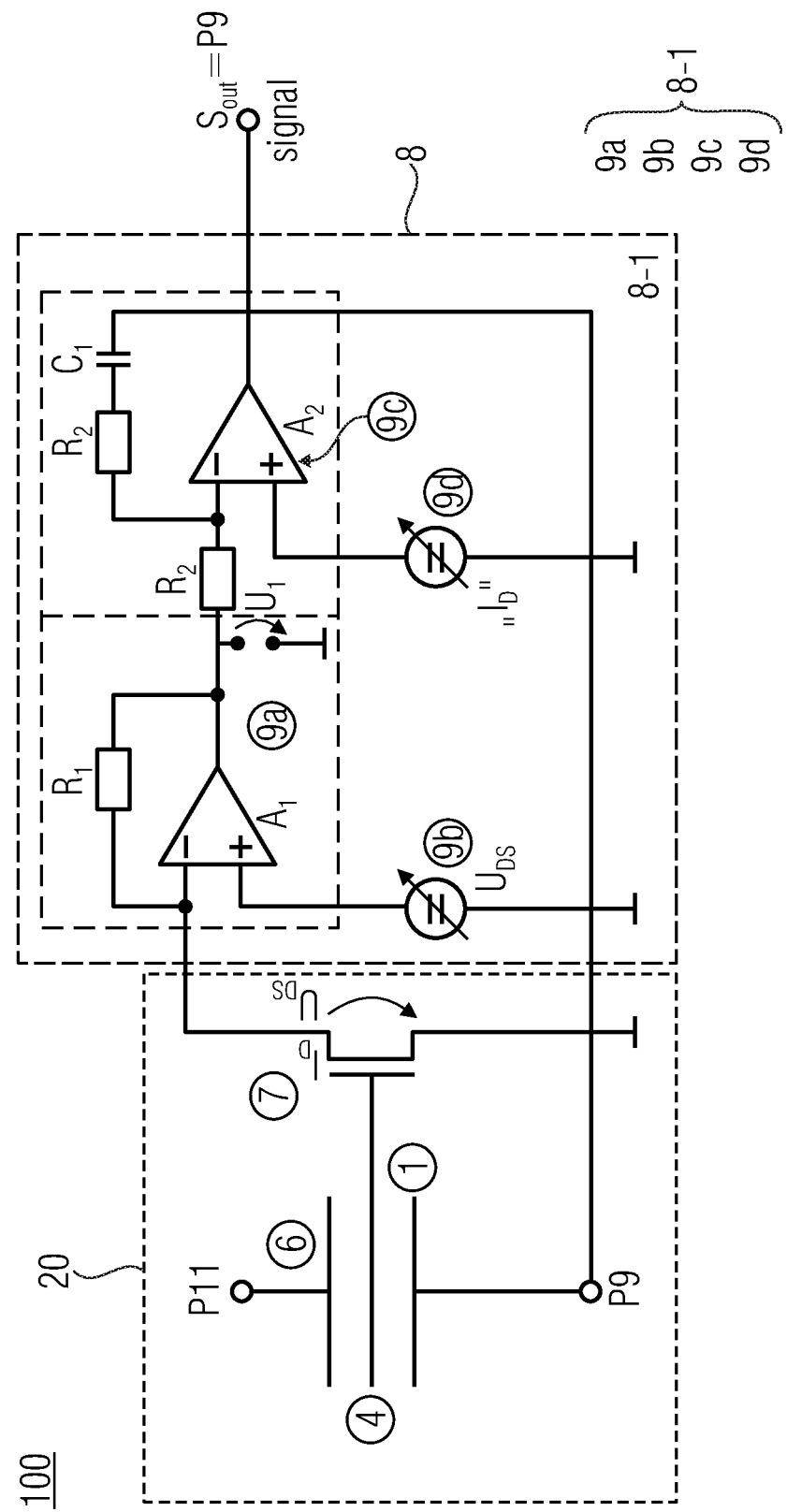
FIG. 2 is a basic schematic circuit-technology illustration of the processing means of the fluid sensor according to an embodiment.

As illustrated in FIG. 2, the fluid sensor 100 comprises the fluid sensor element 20, wherein the isolation layer arrangement 2 is arranged between the floating gate electrode 4 and the substrate electrode 1, and wherein the sensor layer 6 is arranged adjacent to the floating gate electrode 4 of the transistor 7, wherein a further isolation layer arrangement 5 is arranged between the sensor layer 6 and the floating gate electrode 4. The sensor layer 6, the floating gate electrode 4 and the substrate electrode 1 are arranged such that the first capacitance $C_{41}$ is formed between the substrate electrode 1 and the floating gate electrode 4, and further a second capacitance $C_{46}$ is formed between the floating gate electrode 4 and the sensor layer 6, wherein the first capacitance $C_{41}$ and the second capacitance $C_{46}$ form the capacitance ratio $K=C_{41}/C_{46}$.

The processing means 8 is configured to hold the transistor 7 at an operating point OP and to set the regulation potential P9 at the substrate electrode 1 during operation of the fluid sensor using the capacitance ratio K such that the regulation potential P9 at the substrate electrode 1 is the value of the potential P11 at the sensor layer 6 increased by the capacitance ratio K, with $P_9=K*P_{11}$. The operating current $I_D$ and the operating voltage UDS of the transistor 7 are predetermined at the operating point OP of the transistor 7. Further, the regulation potential P9 is proportional to the electric change P11 of the sensor layer 6 in the recess 1 caused by the fluid F to be examined, wherein the regulation potential P9 or a signal P9 that is derived therefrom or rendered is the sensor output signal $S_{OUT}$ of the fluid sensor 100.

As illustrated in FIG. 2, the processing means 8 comprises a circuit 8-1 having a transimpedance amplifier 9a, a voltage source 9b, a regulation circuit 9c and a further voltage source 9d.

The transimpedance amplifier 9a, also current-voltage converter or I-U-converter is an electrical amplifier converting an input current into a proportional output voltage and is hence effective as current-controlled voltage source. The ratio of output voltage to input current is referred to as transimpedance. In the arrangement illustrated in FIG. 2, the transimpedance amplifier 9a converts the drain current $I_D$ of the transistor 7 into a proportional voltage $U_1$ at the output of the transimpedance amplifier 9a.

The voltage source 9b connected to the positive (+) input of the transimpedance amplifier 9a provides the voltage $U_{DS}$ to set the voltage $U_{DS}$ at the transistor 7. The regulation circuit 9c is, for example, configured as PI regulator (=proportional-integral-regulator) and provided for tracking the substrate electrode potential P9. The voltage source 9d connected to the positive input of the regulation circuit 9c is provided for setting the drain current $I_D$.

The circuit for implementing the functionality of the processing means 8 illustrated in FIG. 2 ensures that the transistor 7 is held at the operating point OP and that the regulation potential P9 at the substrate electrode 1 is set during operation of the fluid sensor using the capacitance ratio K such that the regulation potential P9 at the substrate electrode 1 is the value of the potential P11 at the sensor layer 6 increased by the capacitance ratio K, with $P_9=K*P_{11}$.

Thus, the processing means 8 can be configured as a circuit 8-1 for generating the sensor output signal $S_{OUT}=P9$.

The circuit 8-1 of FIG. 1 has the effect that the transistor 7 is operated at predetermined drain current $I_D$ and predetermined drain source voltage. A unique gate source potential at the floating gate electrode 4 is associated to these parameters. If a change of potential at the sensor layer 6 occurs, the gate potential P4 at the floating gate electrode 4 of the transistor 7 changes. The circuit or regulation circuit 8-1 changes the potential P9 at the substrate electrode 1 to restore the original state or operating point OP. Therefore, the signal P11 of the sensor layer 6 amplified at the substrate electrode 1 by the capacitive voltage divider effect or the capacitance ratio K is available as the potential P9 or the output signal $S_{OUT}$, wherein the potential P11 is the sensor potential at the sensor layer 6.

In the fluid sensor element 20 of the fluid sensor 100, the potential P11 of the sensor layer 6 is not directly accessible, such that the processing means 8 is configured to indirectly generate the control potential P8 for the additional electrode 3 and/or the further additional electrode 3a. According to an embodiment, there is an option of calculating the potential P8 of the quantities of capacitances $C_{41}$ and $C_{46}$ as well as the regulation potential P9. The potential P4 at the floating gate electrode 4 can be determined by selecting the drain current $I_d$ and the drain source voltage $U_{ds}$ at the transistor 7 and is hence also known. The processing means 8 is configured to calculate the control potential P8 within a tolerance range based on the following formula, e.g., without considering an optional correction potential $P_{k\text{-}optional}$:

$$P_8 = (P_4 - P_9)\frac{C_{41}}{C_{46}} + P_4,$$

wherein $$P_4 = \frac{I_D}{\beta \cdot V_{DS}} + V_T$$

and $$\beta = \mu \cdot \frac{w}{L} \cdot \frac{\varepsilon_{ox}}{d_{ox}}$$

is the transconductance of the transistor and $V_T$ is the threshold voltage of the transistor µ is the mobility of the charge carriers, W is the width and L the length of the transistor channel, $\varepsilon_{ox}$ is the permittivity of the gate oxide of the transistor and $d_{ox}$ is the thickness of the gate oxide of the transistor.

β and $V_T$ can be determined, for example, by measurements at structurally equal transistors.

In the following, based on the basic schematic cross-sectional illustration illustrated in FIG. 3, a fluid sensor element 20 and an associated processing means of a fluid sensor 100 will be illustrated according to a further embodiment.

Figure 3:
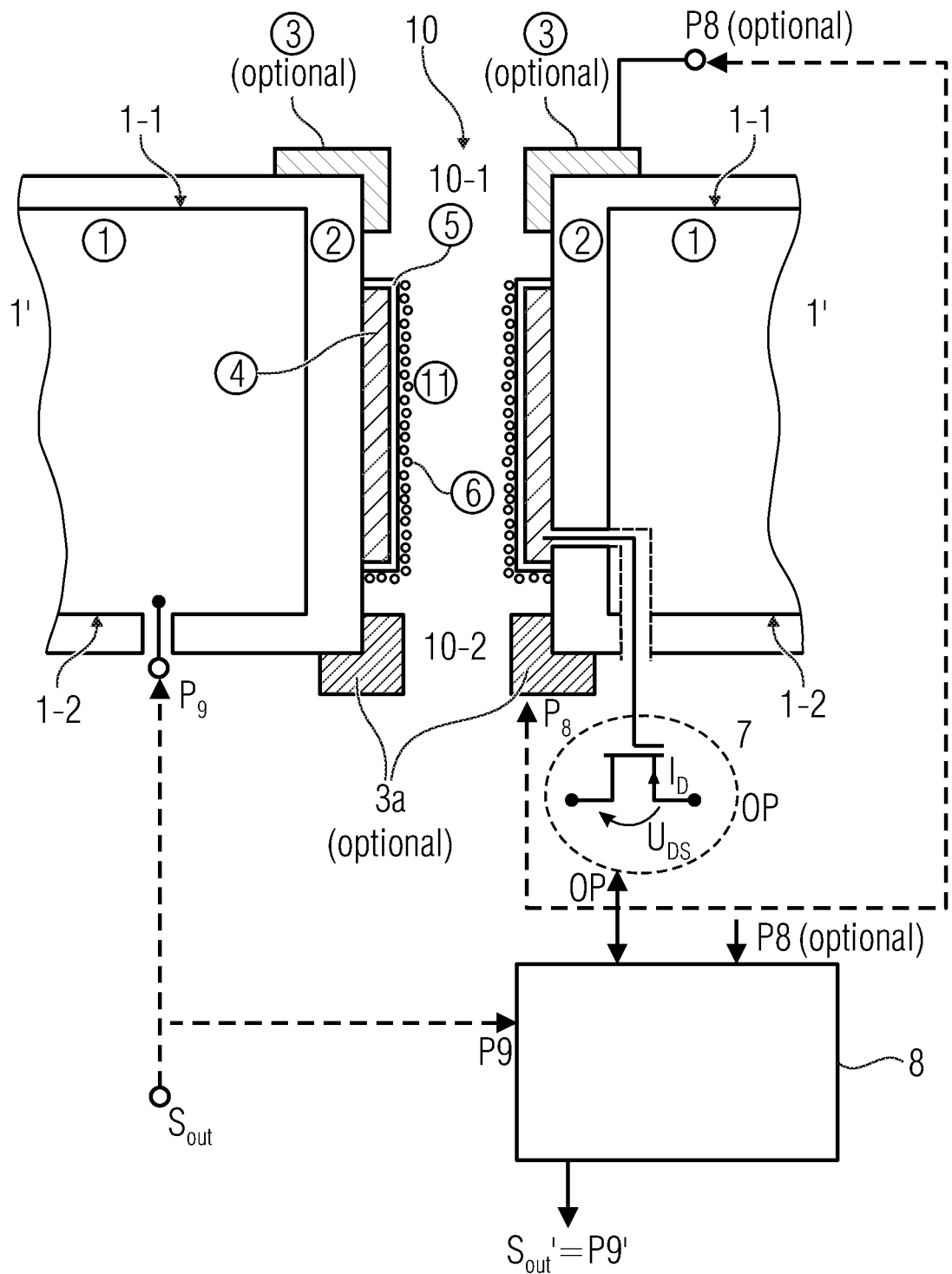
FIG. 3 is a basic schematic cross-sectional illustration of a fluid sensor element and an associated processing means of a fluid sensor according to a further embodiment.

In contrary to the illustration of FIG. 1, wherein the recess 10 according to an embodiment is configured to be closed on one side or to be cup-shaped, in the embodiment illustrated in FIG. 3, the recess 10 is configured as passage or via through the substrate from a first main surface area 1-1 on a first side of the substrate 1 to a second main surface area 1-2 on a second side of the substrate 1. Therefore, the recess 10 is configured to be open on two sides.

Regarding the subsequent explanations, it should be noted that essentially the above statements regarding FIGS. 1 and 2 are equally applicable to the fluid sensor 100 illustrated in FIG. 3, wherein in the following mainly the variations or supplements of the fluid sensor 100 will be discussed.

According to an embodiment, the optional additional electrode 3 is arranged bordering on the opening area 10-1 of the recess 10 on the first side of the substrate 1 and electrically isolated from the sensor layer 6 and is connected or connectable to a control potential, wherein a further optional additional electrode 3a is arranged bordering on a further opening area 10-2 of the recess 10 on the second side of the substrate 1 and electrically isolated from the sensor layer 6 and connected or connectable to the control potential P8.

According to an embodiment, the processing means 8 is further configured to set the control potential P8 during operation such that the electric field between the optional additional electrode 3 and the sensor layer 6 is at least reduced or compensated and that an electric field between the further optional additional electrode 3a and the sensor layer 6 is at least reduced or compensated.

According to an embodiment, the recess 10 extends at a further opening area 10-2 from the second surface area 1-2 of the substrate 1' into the substrate 1'.

As already stated above, the additional electrode 3 can be configured as outer ring, inner ring or L-shaped combination of outer and inner ring at the opening area 10-1 of the recess 10. Similarly, the further additional electrode 3a can be arranged as outer ring, inner ring or L-shaped combination of outer and inner ring at the further opening area 10-2 of the recess 10.

In the following, based on the basic schematic cross-sectional illustration illustrated in FIG. 4a, a fluid sensor element 20 and an associated processing means 8 of a fluid sensor 100 according to a further embodiment will be described. As exemplarily illustrated in FIG. 4a, the fluid sensor 100 comprises a fluid sensor element 20 and processing means 8.

The fluid sensor element 20 comprises a substrate 1 comprising a recess 10 for receiving a fluid F to be examined, wherein the substrate 1 surrounding the recess 10 is formed, at least in parts, as substrate electrode 1. An isolation layer arrangement 2 is arranged between a floating gate electrode 4 of a transistor 7, for example an FGFET=Floating Gate FET and the substrate electrode 1. Further, a sensor layer 6 is arranged in the recess 10 and adjacent to the floating gate electrode 4 of the transistor 7. Here, for example, a further isolation layer arrangement 5 can be arranged between the sensor layer 6 and the floating gate electrode 4. According to a further embodiment, the fluid-sensitive material of the sensor layer 6 can also be formed close to the surface or at the surface of the isolation material of the further isolation layer arrangement 5.

Further, an additional electrode 3 is provided at an opening area 10-1 of the recess 10, wherein the additional electrode 3 is arranged electrically isolated from the sensor layer 6, the substrate electrode 1 and the floating gate electrode 4 and is connected or connectable to a control potential P8.

The processing means 8 is now configured to provide the control potential P8 at the additional electrode 3 such that an electric filed E between the additional electrode 3 and the sensor layer 6 is at least reduced or compensated during operation of the fluid sensor 100.

Figure 4A:
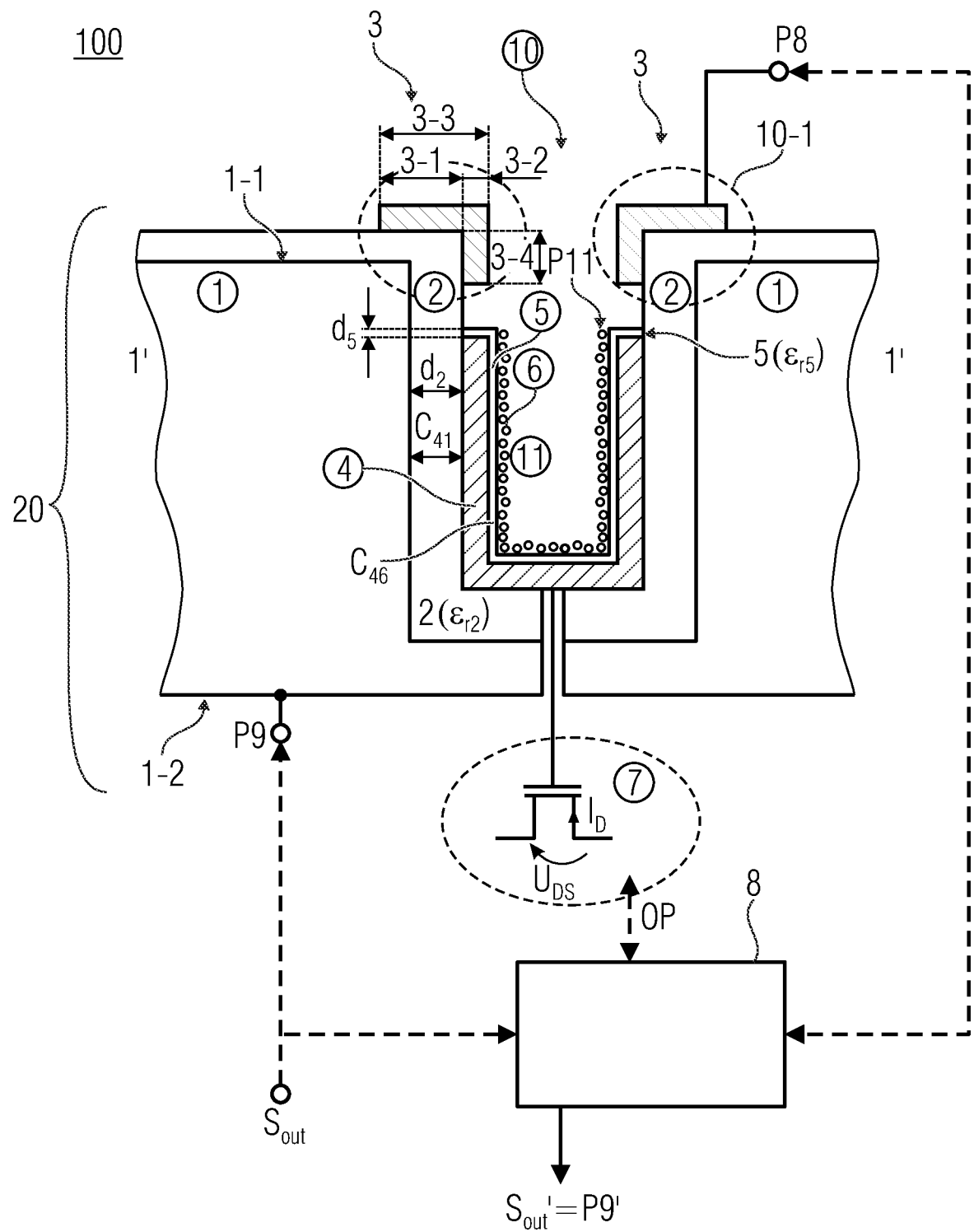
FIG. 4a is a basic schematic cross-sectional illustration of a fluid sensor element and an associated processing means of a fluid sensor according to a further embodiment.

As illustrated in FIG. 4a, starting from the processing means, dotted double arrows to further elements of the fluid sensor 10 are indicated, i.e., for example to the transistor 7 and to the substrate electrode 1. These dotted double arrows indicate that the processing means 8 is connected to the respective element to detect a signal and/or a characteristic of the respective element and/or further to provide a signal, for example a control and/or regulation signal, to the respective elements or to supply or control the respective element with a signal.

According to embodiment, the processing means 8 is configured to set the control potential P8 to a current sensor potential P11 at the sensor layer 6, wherein the current sensor potential P11 is effected as an electric change or change of charge at the sensor layer 6 by the fluid F to be examined.

According to a further embodiment, the processing means 8 is further configured to hold the transistor 7 at an operating point OP and to set the regulation potential P9 at the substrate electrode 1 during operation of the fluid sensor, wherein the regulation potential P9 is proportional to the electric changes or charge P11 of the sensor layer 6 in the recess 1 caused by the fluid F to be examined, and wherein the regulation potential P9 or a signal P9' that is derived therefrom or rendered is the sensor output signal $S_{OUT}$ of the fluid sensor 100.

According to a further embodiment, the fluid sensor 100 can obtain a very low drift behavior and high sensitivity by effectively suppressing the drift or the drift behavior of the fluid sensor 100. This is obtained by adapting the structure such that no electric field occurs between the sensor layer 6 and the edge area 10-1 of the fluid sensor element or the edge area of the recess 10 arranged in the substrate. This state can be obtained by the additional electrode 3 at the opening area 10-1 of the recess 10, wherein the additional electrode 3 is kept essentially at the same potential P8 as the sensor layer 6 by a suitable control apparatus or processing means 8. Thereby, change of charge of the sensor layer 6 is prevented and the drift suppressed. Since the recess 10 represents an essentially field-free space, the same also reacts insensitively to charges in the volume.

As illustrated exemplarily in FIG. 4a, the recess 10 at the opening area 10-1 extends from a first main surface area 1-1 of the substrate 1 into the substrate 1.

According to an embodiment, the optional additional electrode 3 can be configured, adjacent to the opening area 10-1 of the recess 10 bordering on the top main surface area 1-1 of the substrate 1', as a disc-shaped outer ring 3-1 and/or 3-3, within the recess 10 as a circumferential inner ring 3-4 at the wall area of the recess 10 or as an L-shaped combination of the disc-shaped outer ring 3-3 and the inner ring 3-4.

As further illustrated in FIG. 4a, the additional electrode 3 can be configured as an outer ring arranged adjacent to the first main surface area 1-1 of the substrate 1', e.g., on the isolation layer arrangement 2, or as an inner ring 3-4 arranged bordering on a side wall area of the recess 10, e.g., on the isolation layer arrangement 2, or as an L-shaped combination of the outer ring 3-1, 3-3 and the inner ring 3-4. Thus, the additional electrode 3 can be configured adjacent to the first main surface area 1-1 of the substrate 1, e.g., on the isolation layer arrangement 2 circumferentially around the opening area 10-1 of the recess 10, for example as a disc-shaped outer ring 3.1. As is illustrated in FIG. 4a, the additional electrode 3 can further comprise, for example, an overhang area 3-2 extending beyond the edge of the recess 10 and into the opening area 10-1 or beyond the opening area 10-1. Thereby, the overhang area 3-2 of the additional electrode 3 leaves the opening area 10-1 of the recess 10 at least partly free.

According to a further embodiment, the additional electrode 3 can comprise an extension area 3-4 extending from the overhang area 3-2 into the recess 10 and being arranged circumferentially at the wall area of the recess 10. According to a further embodiment, the additional electrode 3 can also be arranged only adjacent to the opening area 10-1 within the recess 10 and circumferentially at a wall area of the recess 10 and form a so-called inner ring.

According to one embodiment, the recess 10 can be configured in the shape of a trench, a passage, a cup or a gap in the substrate. In the configuration of the recess 10 illustrated in FIG. 4*a*, the same is closed on one side or configured in a cup-shaped manner. According to an embodiment, the transistor 7 is arranged outside the recess 10, wherein the floating gate electrode 4 in the recess 10 is electrically connected to the control terminal (gate terminal) of the transistor 7 configured as a field effect transistor.

As already discussed above, according to one embodiment, the recess 10 can also be configured as a passage or via through the substrate 1 from a main surface area 1-1 on a first side of the substrate 1 to a second main surface area 1-2 on a second side of the substrate 1.

In the recess 10, in which the fluid sensor element 20 is provided, an essentially electrically field free space is generated, even when equally distributed charges are located inside this recess 10. The substrate electrode 1 can, for example, form some sort of Faraday cage with respect to the recess 10. Thereby, a drift caused by charges within the volume can be excluded. Further, the provided additional electrode 3 can prevent that an electric field results at the edge area of the edge 10-1 of the recess 10, which continues to attract charges and would hence cause a drift. By providing the additional electrode 3, the structural transistor transconductance can be significantly increased.

In this embodiment, the "capacitive voltage divider" can also be applied by selecting the capacitance $C_{46}$ between sensor layer 6 and floating gate electrode 4 to be relatively large and by selecting the capacitance $C_{41}$ between floating gate electrode 4 and substrate electrode 1 to be relatively small. In that way, a significantly higher potential P9 is needed on the substrate electrode 1 to compensate the influence of the influenced charge P11 from the sensor layer 6. Different capacitances ratios can be obtained by different layer thicknesses $d_2$, $d_5$ or different materials having different permittivities $\varepsilon_{r2}$, $\varepsilon_{r5}$ (=dielectric conductivities) for the first and second isolation layer arrangement 2, 5. In that way, the capacitive voltage divider can be used for amplifying the sensor signal when the substrate electrode is regulated and the substrate electrode potential is used as sensor signal.

If, for example, the further isolation layer arrangement 5 comprises an $SiO_2$ material layer ($\varepsilon_r$=3.9) and the sensor layer 6 comprises, for example an $Si_3N_4$ material layer ($\varepsilon_r$=7.5), the layer thickness d5 can be considered, for example, as a combined effective layer thickness $d_5$ of the $SiO_2$ material layer 5 and the $Si_3N_4$ material layer 6 by considering the respective relative permittivities of $SiO_2$ and $Si_3N_4$.

According to an embodiment, the sensor layer 6, the floating gate electrode 4 and the substrate electrode 1 can be arranged such that a first capacitance $C_{41}$ is formed between the substrate electrode 1 and the floating gate electrode 4 and further a second capacitance $C_{46}$ is formed between the floating gate electrode 4 and the sensor layer 6 and wherein the substrate electrode 1 of the fluid sensor element at least partly surrounds the recess 10 and is connected or connectable to a regulation potential P9.

Further, the processing means 8 can be configured to hold the transistor 7 at an operating point and to set the regulation potential P9 at the substrate electrode 1 "during operation" of the fluid sensor using the capacitance ratio $K=C_{41}/C_{46}$ such that the regulation potential P9 at the substrate electrode 1 is the value of the sensor potential P11 at the sensor layer 6 increased by the capacitance ratio K with $P_9=K \cdot P_{11}$.

The processing means 8 can further be configured to determine the control potential P8 for the additional electrode based on the regulation potential P9.

If charges are formed at the sensor layer 6 due to the fluid F, i.e., a gas or gas mixture or liquid or liquid mixture in the recess 10, a respective change of potential results at the sensor layer 6 and further a respective change of the gate potential P4 at the floating gate electrode 4 of the transistor 7. The processing means or regulation circuit 8 is configured to change the potential P9 at the substrate electrode 1 to restore the original state or operating point OP. Thereby, the signal P11 of the sensor layer 6 amplified at the substrate electrode 1 by the capacitive voltage divider effect or the capacitance ratio K is available as the potential P9 or the output signal $S_{OUT}$, wherein P11 is the sensor potential at the sensor layer 6.

According to an embodiment, the sensor layer 6, the floating gate electrode 4 and the substrate electrode 1 or the isolation layer arrangement 2 arranged between the substrate electrode 1 and the floating gate electrode 4 and the further isolation layer arrangement 5 arranged between the sensor layer 6 and the floating gate 4 are arranged or set with respect to their thicknesses $d_2$, $d_5$ and/or permittivities $\varepsilon_{r2}$, $\varepsilon_{r5}$ to obtain a capacitance ratio $K=C_{41}/C_{46}$ with K≥2, 5, 8 or 10 (or more). The substrate electrode 1 can correspond, for example, to a delimited doped region (doping region with increased conductivity) of the substrate 1'.

In one embodiment, the substrate electrode 1 can correspond to a delimited doping region of the substrate 1', for example a p or n doping of the substrate 1'. This delimited doping region 1 is delimited, for example, by a pn junction, from a bordering substrate area 1', such that a desired potential can be applied to the delimited doping region.

The substrate electrode 1 can, for example, also be formed by a respectively configured or formed conductor 1, such as a metal or metal coating on the substrate 1'.

The chemically sensitive layer 6 is configured to convert, for example, chemical reactions, passage of ions, physical adsorption, chemical adsorption, change of dipole moments, etc., into electrical changes, for example by changing the charge state or the dielectricity constant.

Thus, the sensor layer 6 can be isolated from the floating gate electrode 4 of the transistor 7 by the further isolation layer arrangement 5. The charge at the sensor layer 6 caused by chemical reactions or addition reactions of the fluid F to be examined at the sensor layer 6 influences a counter charge at the floating gate electrode 4 connected to the gate terminal (control terminal) of the transistor 7 and can hence be detected. By the isolation layer arrangement 2 between the gate electrode 4 and the substrate electrode 1, the gate electrode 4 is isolated from the substrate 1 in which the recess 10 is provided. If this substrate 1 has, for example, a semiconductive or conductive material, the same forms the substrate electrode 1. Thereby, a capacitive voltage divider results between the sensor layer 6, the floating gate electrode 4 and the substrate electrode 1.

According to the present concept, the drain current of the transistor 7 is a measure for the potential P4 of floating gate electrode P4. If this drain current $I_D$ is kept constant by regulating the substrate electrode potential P9, the substrate potential P9 compensates the potential P6 of the sensor layer 6. If the capacitance $C_{46}$ between sensor layer 6 and floating gate electrode 4 is selected to be relatively large and the capacitance $C_{41}$ between floating gate electrode 4 and substrate electrode 1 is selected to be relatively small, a significantly higher potential P9 is needed at the substrate electrode 1 to compensate the influence of the influenced charge from the sensor layer 6. Different capacitance ratios can be obtained by different layer thicknesses $d_2$, $d_5$ or different materials with different permittivities $\varepsilon_{r2}$, $\varepsilon_{r5}$ (dielectric conductivities) for the first and second isolation layer arrangements 2, 5.

In that way, the capacitive voltage divider with $C_{41}$ and $C_{46}$ can be used for amplifying the sensor signal $S_{OUT}$ when the substrate electrode 1 is regulated and the substrate electrode potential P9 is used as a sensor signal $S_{OUT}$. If, for example, the isolation layer arrangement 2 between the substrate electrode 1 and the floating gate electrode 4 is selected to be n times as thick as the second isolation layer arrangement 5 between the sensor layer 6 and the floating gate electrode 4 with the same permittivities $\varepsilon_{r2}$, $\varepsilon_{r5}$ of the isolator materials, an n time higher sensor output signal $S_{OUT}$ is obtained compared to the case when both isolation layers are configured to have the same thickness.

In the fluid sensor element 20 of the fluid sensor 100, the potential P11 of the sensor layer 6 is not directly accessible, such that the processing means 8 is configured to indirectly generate the control potential P8 for the additional electrode 3 and/or the further additional electrode 3a. According to an embodiment, the potential P8 can be calculated from the quantities of the capacitances $C_{41}$ and $C_{46}$ as well as the regulation potential P9. The potential P4 at the floating gate electrode 4 can be determined by selecting the drain current $I_d$ and the drain source voltage $U_{ds}$ at the transistor 9 and is hence is also known. The processing means 8 is now configured to calculate the control potential P8 within a tolerance range based on the following formula, e.g., by considering an optional correction potential $P_{k\text{-}optional}$:

$$P_8 = (P_4 - P_9)\frac{C_{41}}{C_{46}} + P_4 + P_{K\text{-}optional}, \text{ with } P_4 = \frac{I_D}{\beta \cdot V_{DS}} + V_T,$$

The tolerance range can be in a range of 1% (=±0.005), 10% (=±0.05), 20% (=±0.01) or also 50% (=±0.25). For example, non-considered influence quantities or environmental parameters that are to consider a slight deviation of the obtained result from an "ideal" result are incorporated in the tolerance range. The temperature is, for example, one influencing parameter.

The optional correction potential $P_{k\text{-}optional}$ or $\Delta U$ can be combined with the control potential P8 for considering, for example, a constant offset quantity that cannot be detected and considered by the processing means or regulation circuit 8. Such an offset quantity can be generated, for example, by fixed charges at the floating gate electrode 4.

The optional correction potential can, for example, be predetermined according to the system, e.g., to consider different work functions using the materials due to different material constants. The additional electrode 3 or further additional electrode 3 and its control, e.g., also by means of the optional correction potential can be used for reducing or compensating interferences and influences by different work functions.

In the following, according to a further embodiment, the formula for the control potential P8 determined and provided by the processing means 8 of the fluid sensor 100 is derived in FIG. 4b-c based on schematic circuit-technology diagrams of equivalent diagrams of the capacitive voltage divider $C_{41}$-$C_{46}$. The following embodiments relate merely exemplarily to computational estimations for typical materials of a fluid sensor 100 as well as to computational derivation of the above stated formula (cup voltage formula).

The dimensions and the used materials of the different layers of the fluid sensor element 20 (cup) and the substrate 1' (chip) are generally known, so that essential quantities such as the capacitance $C_{41}$, $C_{46}$ of the fluid sensor elements 20 can also be mathematically determined.

Figure 4B:
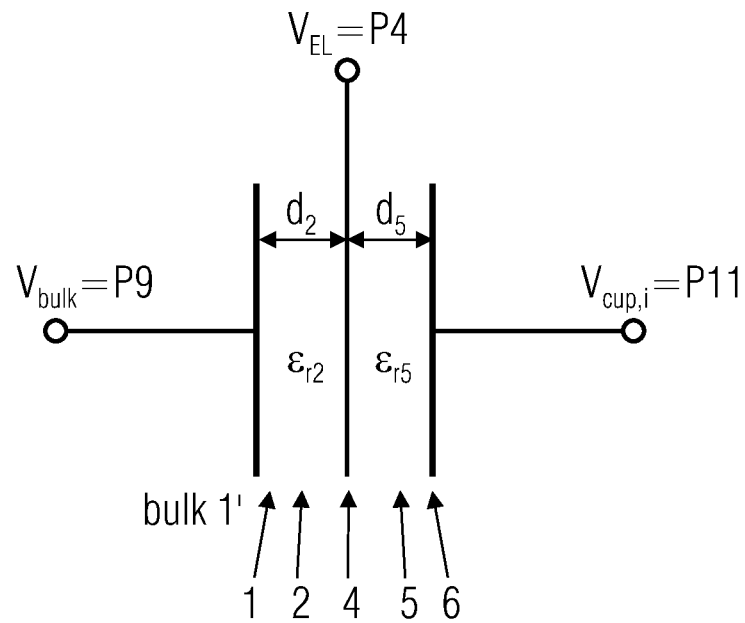
FIG. 4b-4c are basic equivalent diagrams of the capacity voltage divider of the fluid sensor element for deriving the formula for the control potential P8 according to a further embodiment.

For this, FIG. 4b shows a sketch of an exemplary structure of a fluid sensor element 20. An isolation layer 2, e.g., $SiO_2$, the floating electrode (floating gate electrode 4) and the further isolation layer arrangement 5, which can comprise, e.g., an $SiO_2$ material or optionally also an $SiO_2$ material layer and an $Si_3N_4$ material layer (as sensor layer 6) is provided on the semiconductor substrate 1 (bulk). The relative permittivity of $SiO_2$ is $\varepsilon_r=3.9$ and the one of $Si_3N_4$ is $\varepsilon_r=7.5$.

The representation of FIG. 4b outlines the layer structure of the fluid sensor element (cups) 20, wherein, e.g., the following layer thicknesses are assumed: $d_2$=100 nm, $d_5$=66 nm.

The layer thickness d5 can be considered, for example, as a resulting effective layer thickness $d_5$ of the $SiO_2$ material layer and the $Si_3N_4$ material layer by considering the relative permittivities of $SiO_2$ and $Si_3N_4$ The capacitances can now be estimated very easily, for example by assuming a plate capacitor structure:

$$C_1 = C_{41} = \varepsilon_0 \cdot \varepsilon_r \cdot \frac{A}{d_2} = \varepsilon_0 \cdot 3,9 \frac{A}{100 \text{ nm}} \approx 3,453 \cdot 10^{-22} \frac{F}{nm^2} \cdot A$$

$$C_2 = C_{46} = \varepsilon_0 \cdot \varepsilon_r \cdot \frac{A}{d_5} = \varepsilon_0 \cdot 3,9 \frac{A}{66 \text{ nm}} \approx 5,232 \cdot 10^{-22} \frac{F}{nm^2} \cdot A$$

wherein $d_2$ and $d_5$ relate to the layer thicknesses of isolation layer arrangements 2 and 5 and A is the area of a capacitor plate. Here, the same is unknown. The same can also be estimated very easily via the dimensions of the cup, since the individual layer thicknesses are in the submicrometer range, the same can be neglected. The cup (the recess 10) is, for example, 600 µm long, 100 µm wide and 450 µm deep, which results in a surface of approximately 690,000 $\mu m^2$, i.e., $6.9 \cdot 10^{11}$ $nm^2$. Mathematically, this results in the following capacitances:

$$C_{41} \approx 238 \text{ } pF \text{ and } C_{46} \approx 261 \text{ } pF$$

The value for $C_{41}$ corresponds very well to the value of approximately 250 pF estimated by measurements.

In order to make statements on the charges in the cup, it has to be estimated first whether natural oxide charges at the interface of substrate (bulk) 1' and isolation layer arrangement 2 can have a significant influence on the threshold voltage. For this, oxide charges of approximately $$3 \cdot 10^{10} \frac{e}{cm^2}$$

can be calculated. With $$U = \frac{Q}{C} \text{ and } 3 \cdot 10^{10} \frac{e}{cm^2} \approx 4,807 \cdot 10^{-23} \frac{c}{nm^2},$$

$$U_{ox} = \frac{4{,}807 \cdot 10^{-23} \frac{C}{nm^2} \cdot A}{3{,}453 \cdot 10^{-22} \frac{F}{mm^2} \cdot A} \approx 0{,}139 \text{ V},$$

follows, i.e., a relatively low voltage which is why the same is no longer considered in further estimations.

With a known threshold voltage of the MOSFET without cup control $V_{th,FET}$=P4 and with cup control $V_{th,Cup}$=P9, the voltage that is generated by the charges in the cup can be calculated via the ratio of the two (effective) oxide layers 2, 5 relative to $V_{th,FET}$=P4. Thus, for the voltage $V_{Cup,i}$=P8 generated by the charges, the following cup voltage formula results:

$$V_{Cup,i} = (V_{th,FET} - V_{th,Cup}) \cdot \frac{d_5}{d_2} + V_{th,FET}$$

Since the threshold voltage of the n channel MOSFET without cup control is at approximately 0.85 V and $d_1$ and $d_2$ are also known, the formula can also be expressed as follows:

$$V_{Cup,i}(V_{th,Cup}) = 1{,}41 \text{ V} - 0{,}66 \cdot V_{th,Cup}$$

or expressed in charges (e):

$$Q_{Cup,i}(V_{th,Cup}) = (1{,}41 \text{ V} = 0{,}66 \cdot V_{th,Cup}) \cdot C_2 =$$
$$= 368 \text{ pC} - 172 \text{ pF} \cdot V_{th,Cup}$$
$$= 2{,}30 \cdot 10^9 e - 1{,}08 \cdot 10^9 \frac{e}{V} \cdot V_{th,Cup}.$$

For example, for a threshold voltage of the MOSFET cup system of −3 V, a voltage of approximately 3.39 V generated by the charges would result, which is triggered by approximately $5.54 \cdot 10^9$ charges.

However, this estimation assumes that no different materials are used or no different work functions are provided. In the system examined herein, this is not the case for the gas measurements, since here, on the one side, silicon is used (with a work function between 3.59 eV and 4.67 eV and, on the other side, palladium (with a work function between 4.49 eV and 4.99 eV). This would therefore result in an additional shift of up to 1.4 eV (corresponding to $2.28 \cdot 10^9$ charges).

The above presented equation "cup voltage formula" will be derived in two ways in the following.

By considering FIG. 4c and by assuming a linear potential curve between substrate 1' (bulk) and recess 10 (inside of the cup) with the same $\varepsilon_r$ ($\varepsilon_{r2} = \varepsilon_{r5}$) and under the assumption that no charges exist within the layers or between the same, the formula can be derived as follows:

At the threshold voltage, the voltage $V_{th,FET}V_{th,Cup}$ ($V_{th,FET}$=P4, $V_{th,Cup}$=P9) is applied between the interfaces between substrate (bulk) 1' and isolation layer arrangement 2 and between first and second isolation layer arrangements 2 and 5. With a linear potential curve between the layers, the voltage between floating electrode 4 and inside of the cup has to be $$(V_{th,FET} - V_{th,Cup}) \cdot \frac{d_5}{d_2}.$$

In order to obtain the absolute value, $V_{th,FET}$ has to be added and the above cup voltage formula is obtained.

Figure 4C:
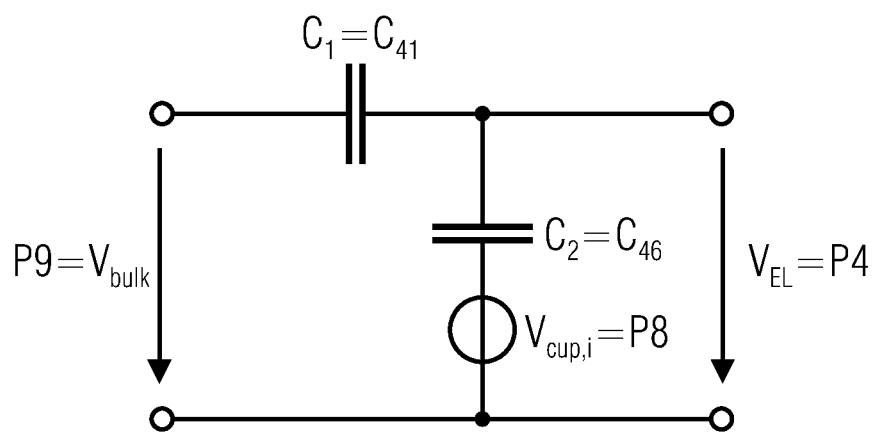

The second derivation is slightly more complicated and is based on the equivalent diagram shown in FIG. 4c of the structure shown in FIG. 4b. Here, the floating electrode 4 can be considered as two capacitor plates $C_1=C_{41}$, $C_2=C_{46}$ which results in a capacitive voltage divider. The voltage at the inside of the cup results from the charge carriers to be measured and can be considered as additional voltage source.

For $V_{Bulk}$ (=P9) and $V_{El}$ (=P4), the following applies:

$$V_{Bulk} = \frac{1}{j\omega C_1}I + \frac{1}{j\omega C_2}I + V_{Cup,i}$$

$$V_{El} = \frac{1}{j\omega C_2}I + V_{Cup,i}.$$

From this follows:

$$\frac{V_{Bulk} - V_{Cup,i}}{V_{El} - V_{Cup,i}} = \frac{\frac{1}{j\omega C_1}I + \frac{1}{j\omega C_2}I}{\frac{1}{j\omega C_2}I} = \frac{\frac{1}{C_1} + \frac{1}{C_2}}{\frac{1}{C_2}} = \frac{C_2}{C_1} + 1,$$

or resolved for $V_{Cup,i}$ (=P8), the cup voltage formula:

$$V_{Cup,i} = (V_{El} - V_{Bulk}) \cdot \frac{C_1}{C_2} + V_{El}.$$

If capacitances according to $$C_v \propto \frac{1}{d_v}$$

are now expressed by the layer thicknesses and $V_{EL}=V_{th,FET}$ and $V_{Bulk}=V_{th,Cup}$ are selected, the above cup voltage formula is obtained.

If the above equation resolved for $V_{Bulk}$, the cup voltage formula results:

$$V_{Bulk} = (V_{El} - V_{Cup,i}) \cdot \frac{C_2}{C_1} + V_{El}.$$

If readjustment by an external voltage $V_{Bulk}$ (=P9) takes place, such that $V_{El}$ (=P4) remains constant, the voltage at the inside of the cup can be calculated from $V_{Bulk}$. With constant $V_{El}$, the following applies:

$$V_{Bulk} = \alpha - \frac{C_2}{C_1} \cdot V_{Cup,i},$$

wherein a is a constant. When $C_2 > C_1$ or, with the same material, $d_5 > d_2$ is selected, a change of the voltage at the inside of the cup causes an amplified change of $V_{Bulk}$, since then $$\left|\frac{\partial V_{Bulk}}{\partial V_{Cup,i}}\right| = \frac{C_2}{C_1} > 1$$

applies.

In the following, based on the basic schematic cross-sectional illustration illustrated in FIG. 5, a fluid sensor element 20 and an associated processing means 8 of a fluid sensor 100 will be illustrated according to a further embodiment.

Figure 5:
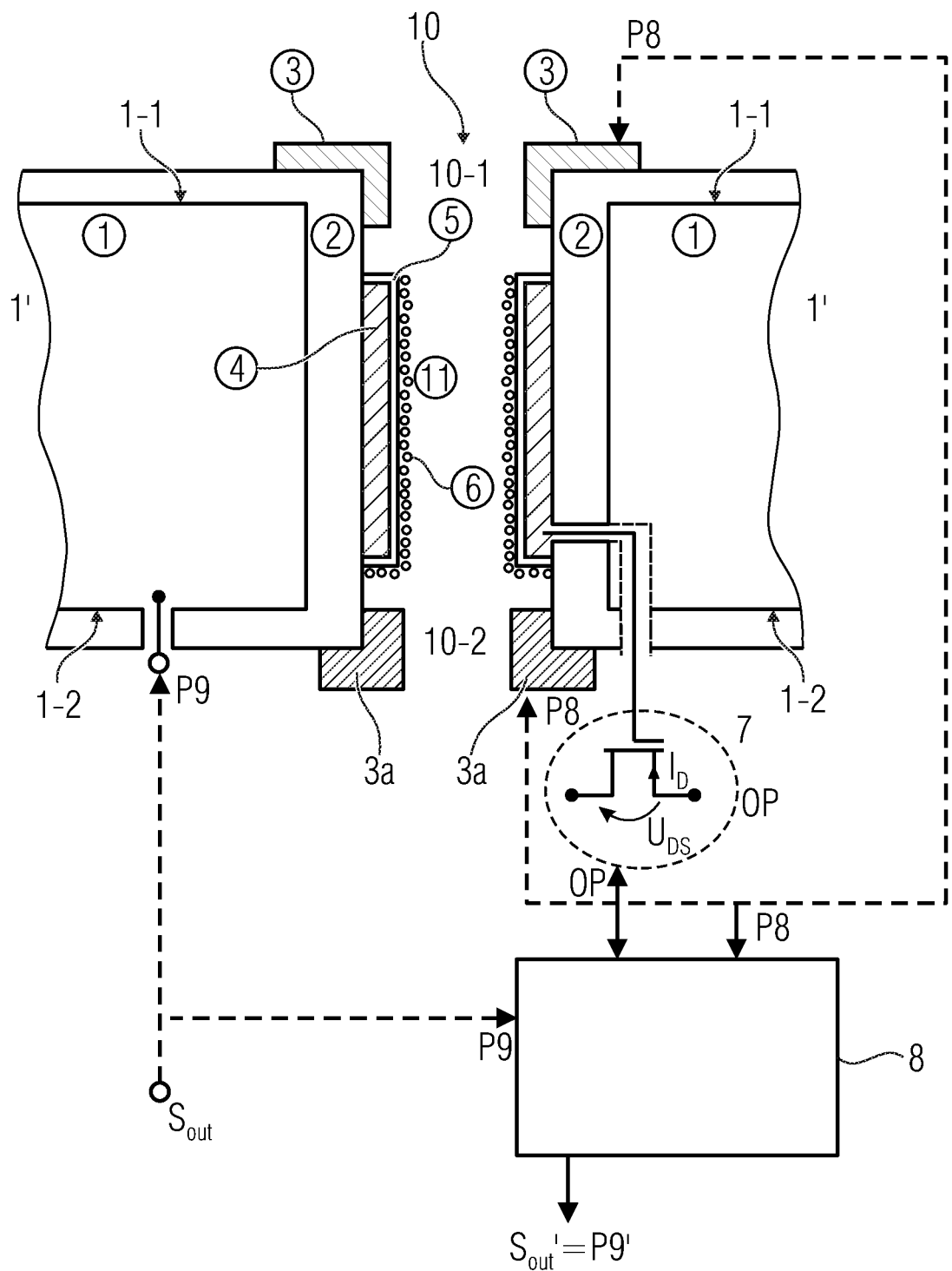
FIG. 5 is a basic schematic cross-sectional illustration of a fluid sensor element and an associated processing means of a fluid sensor according to an embodiment.

In contrary to the illustration of FIG. 4, where the recess 10 is closed on one side or configured in a cup-shape according to an embodiment, in the embodiment illustrated in FIG. 5, the recess 10 is configured as passage or via through the substrate from a first main surface area 1-1 on a first side of the substrate 1 to a second main surface area 1-2 on the second side of the substrate 1. Thus, the recess 10 is configured to be open on two sides.

Regarding the subsequent statements, it should be noted that the above statements concerning FIG. 4a are essentially applicable accordingly to the fluid sensor 100 illustrated in FIG. 5, wherein in the following mainly the variations or supplements of the fluid sensor 100 will be discussed.

According to one embodiment, the additional electrode 3 is arranged bordering on the opening area 10-1 of the recess 10 on the first side of the substrate 1 and electrically isolated from the sensor layer 6 and is connected or connectable to a control potential, wherein a further additional electrode 3a is arranged bordering on a further opening area 10-2 of the recess 10 on the second side of the substrate 1 and electrically isolated from the sensor layer 6 and is connected or connectable to the control potential P8.

According to an embodiment, the processing means 8 is further configured to set the control potential P8 during operation such that the electric field between the additional electrode 3 and the sensor layer 6 is at least reduced or compensated and such that an electric field between the further additional electrode 3a and the sensor layer 6 is at least reduced or compensated.

According to an embodiment, the recess 10 extends at a further opening area 10-2 from the second surface area 1-2 of the substrate 1' into the substrate 1'.

As already stated above, the additional electrode 3 can be configured as an outer ring, inner ring or L-shaped combination of outer ring and inner ring at the opening area 10-1 of the recess 10. Equally, the further electrode 3a can be arranged as outer ring, inner ring or an L-shaped combination of outer ring and inner ring at the further opening area 10-2 of the recess 10.

In the following, based on FIG. 6, a basic schematic cross-sectional illustration of a fluid sensor element and an associated processing means 8 of a fluid sensor 100 according to a further embodiment will be described.

Figure 6:
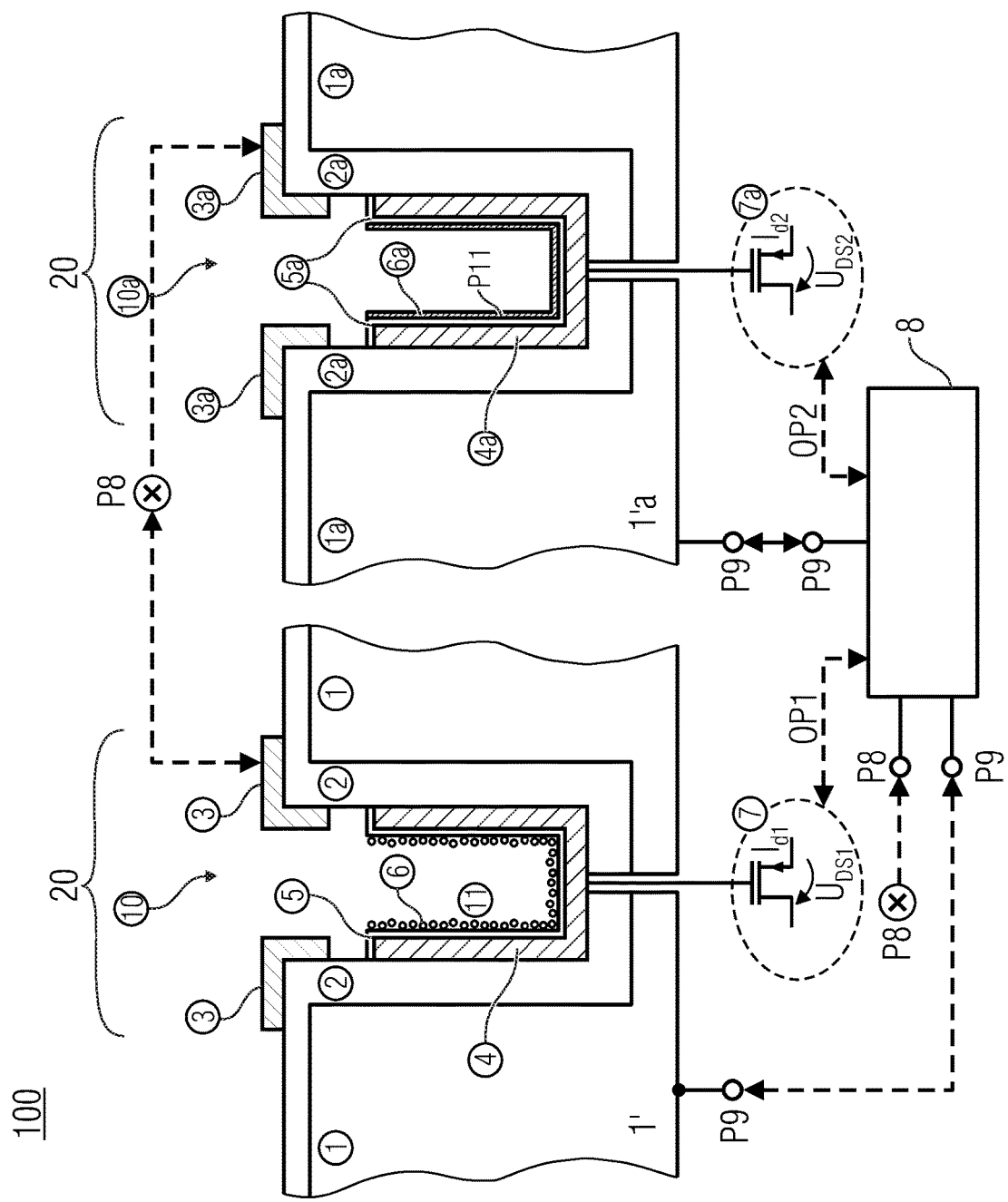
FIG. 6 is a basic schematic cross-sectional illustration of a fluid sensor and an associated processing means of a fluid sensor according to a further embodiment.

As illustrated in FIG. 6, the fluid sensor 100 comprises the fluid sensor element 20 of FIG. 4a as well as a reference sensor element 20a. The reference sensor element 20A is arranged in a further substrate or further substrate area 1a, wherein the further substrate area comprises an (further) recess 10a for receiving a fluid F to be examined, wherein the substrate 1a surrounding the recess 10a is formed, at least in parts, as a substrate electrode 1a. Further, the reference sensor element 20a comprises an isolation layer arrangement 29a between a floating gate electrode 4a of a further transistor 7a and the further substrate electrode 1a. A conductive sensor substitute layer 6a is arranged adjacent to the floating gate electrode 4a of the further transistor 7a (e.g., a FGFET). According to an embodiment, a further isolation layer arrangement 5a can be arranged between the conductive sensor substitute layer 6a and the floating gate electrode 4a. Otherwise, the fluid sensor element 20 and the reference sensor element 20a comprising the conductive sensor substitute layer 6a instead of the sensor layer 6 of the fluid sensor element 20 have essentially the same structure.

The processing means 8 is configured, for example, to determine the control potential P8 based on the sensor potential P11 at the sensor layer 11 and to determine the sensor potential P11 at the sensor layer 6 in the recess 10 based on a reference sensor element 20A.

According to an embodiment, the processing means 8 is further configured to keep the transistor 7 and the further transistor 7a at an equal operating point, such that same sensor potential P11 as at the sensor layer 6 of the fluid sensor element 20 settles at the conductive sensor substitute layer 6a of the reference sensor element 20a.

At its operating point OP1, the transistor 7 comprises a drain source voltage $U_{DS1}$ and the drain current $I_{D1}$, and the further transistor 7a comprises the drain source voltage $U_{DS2}$ and the drain current $I_{D2}$ at its operating point OP2, wherein the following applies essentially for equal operating points OP1 and OP2 of the transistor 7 and further transistor 7a:

$OP1=OP2$ with $U_{DS1}=U_{DS2}$ and $I_{D1}=I_{D2}$

Further, the processing means 8 is, for example, configured to provide the sensor potential P11 applied to the conductive sensor substitute layer 6a or a potential P11' derived therefrom, such as $P11'=P11+P_{K\text{-}optional}$ or with an offset ΔU as the control potential P8 for the additional electrode 3. The processing means 8 can further be configured to provide the control potential P8 for the additional electrode 3 with an optional correction potential $P_{K\text{-}optional}$, for example to consider a constant offset quantity not detected by the processing means or regulation circuit 8. Thus, the regulation potential P9 is proportional to the electric change P11 of the sensor layer 6 in the recess 10 caused by the fluid F to be examined, wherein the regulation potential P9 or signal P9' that is derived therefrom or rendered is the sensor output signal $S_{OUT}$ of the fluid sensor 100.

Thus, the processing means can be configured to obtain a temperature-stable operating point or temperature-stable operating points OP1, OP2 to obtain, for example, the potential P4 on the floating gate electrode at an essentially equal or constant value. Thereby, reverse influence on the sensor potential P11 at the sensor layer 6 is prevented.

In the following, a schematic circuit-technology basic illustration of the processing means 8 of the fluid sensor 100 as regulation circuit for the additional electrode 3 will be described with reference to FIG. 7 according to an embodiment.

Figure 7:
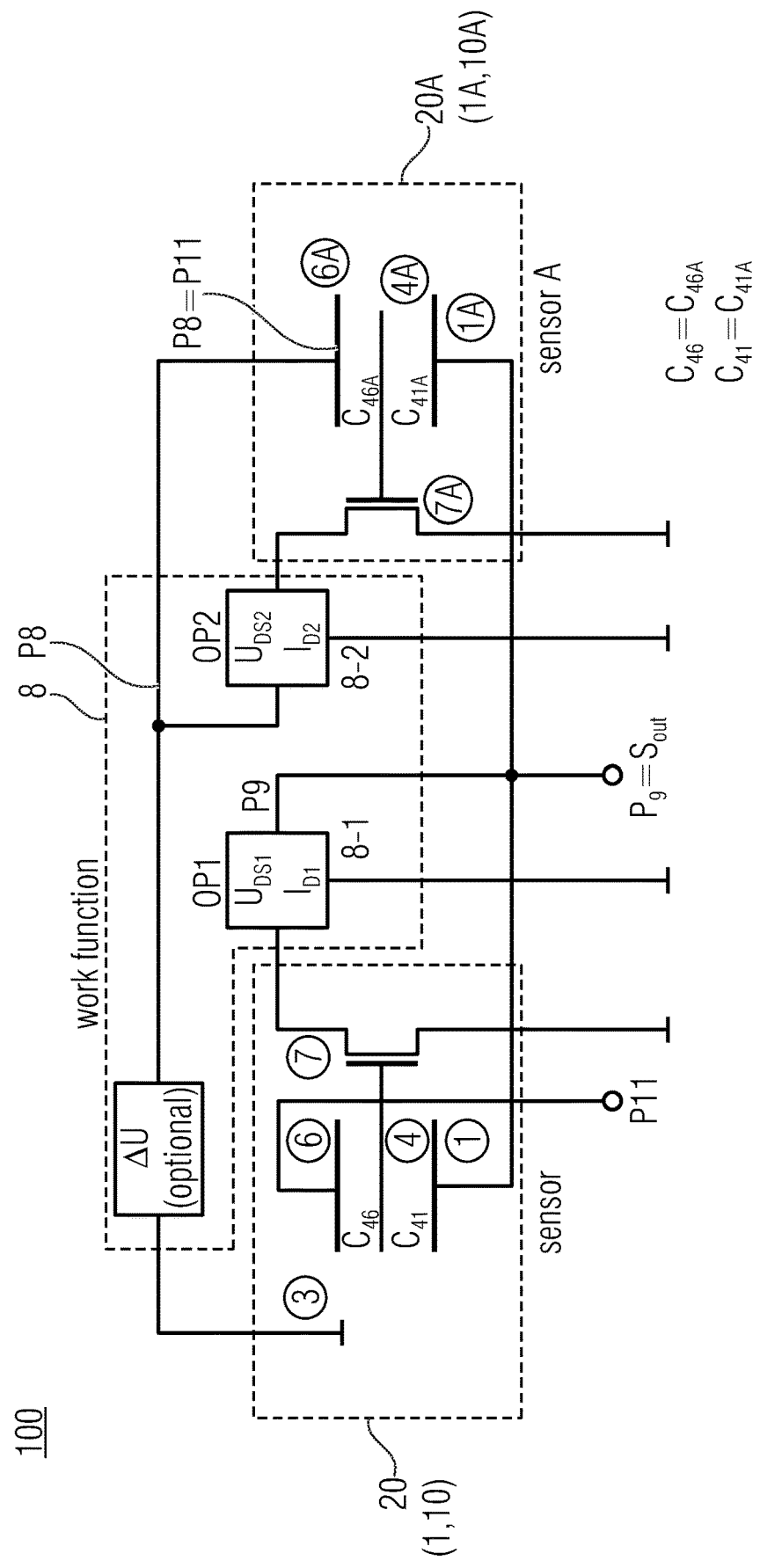
FIG. 7 is a basic schematic circuit-technology illustration of processing means of the fluid sensor according to a further embodiment.

As illustrated in FIG. 7, the fluid sensor 100 comprises the fluid sensor element 20, the reference sensor element 20a as well as the processing means 8 providing the control potential P8 and the regulation potential P9.

The circuit 8-1 is configured to hold the transistor 7 at an operating point OP1 and to set the regulation potential P9 at the substrate electrode 1 of the fluid sensor element 20 and the substrate electrode 1a of the reference sensor element 20A during operation of the fluid sensor 100, e.g., by using the capacitance ratio K, such that the regulation potential P9 at the substrate electrode 1 is the value of the potential P11 at the sensor layer 6 increased by the capacitance ratio K, with $P_9=K*P_{11}$. Thus the processing means 8 can be configured as a circuit 8-1 for generating the sensor output signal $S_{out}=P9$.

The circuit 8-1 of FIG. 7 ensures that the transistor 7 is operated at predetermined drain current $U_{D1}$ and predetermined drain source voltage $U_{DS1}$. A unique gate source potential $U_{GS1}$ at the floating gate electrode 4 is associated with these parameters. If there is a change of potential at the sensor layer 6, the gate potential P4 at the floating gate electrode 4 of the transistor 7 changes. The regulation circuit 8-1 changes the potential P9 at the substrate electrode 1 in order to restore the original state or operating point OP1. Therefore, the signal P11 amplified at the substrate electrode 1 by the capacitive voltage divider effect or the capacitance ratio K is available to the sensor layer 6 as the potential P9 or the output signal $S_{OUT}$, wherein the potential P11 is the sensor potential at the sensor layer 6.

The processing means 8 illustrated in FIG. 7 comprises two processing partial portions or circuits 8-1 and 8-2. The circuit 8-2 comprises a structure and a function for operating point adjustment at the reference sensor element 20*a* as it is described, for example, based on FIG. 2 and the circuit 8-1 as part of the processing means 8.

As can be seen in the schematic diagram of the circuit of FIG. 7 of the processing means 8, the potential at the sensor layer 6 corresponds to the potential at the conductive sensor substitute layer 6*a* of the reference sensor element 20A and the potential P3 at the additional electrode 3 or the further additional electrode 3*a* (not shown in FIG. 7) for $U_{DS1}=U_{DS2}$, $I_{D1}=I_{D2}$, and transistor 7 and transistor 7*a* as well as the fluid sensor element 20 and the reference sensor element 20A have the same structure.

The circuit 8-2 is configured to hold the transistor 7*a* at an operating point OP2 and ensures that the transistor 7*a* is operated at predetermined drain current $I_{D2}$ and predetermined drain source voltage $U_{DS2}$. For the circuit 8-2, the potential P9 is predetermined and the potential P8 is readjusted until, at the same source drain voltages $U_{DS1}$, $U_{DS2}$, the same drain currents $I_{D1}$, $I_{D2}$ settle at the paired transistors 7 and 7*a*. Then, the control potential P8 corresponds to the potential P6 at the sensor layer 6.

According to a further embodiment, a further option for determining the potential P8 is to use a reference sensor element 20*a* that is structurally identical to the fluid sensor element 20 and a reference transistor 7*a* that is structurally identical to the transistor 7. The fluid sensor 100 is thus modified as follows: the sensor layer 6 of the fluid sensor element 20 in the fluid sensor 100 is replaced in the reference sensor element 20*a* by a conductive, i.e., the conductive sensor substitute layer 6*a* in the reference sensor element 20A, wherein the conductive sensor substitute layer 6*a* can be electrically controlled. By the processing means 8 or a regulation circuit or regulation functionality 8-2 implemented by the processing means 8, essentially corresponding to the functionality of the regulation circuit 8-1 of FIG. 2, the potential P8 can be determined or generated in a similar manner. For this regulation stage 8-2 of the processing means 8, the potential P9 is predetermined and the potential P8 is readjusted until, at the same source drain voltages $U_{DS1}$, $U_{DS2}$, the same drain currents $I_{D1}$, $I_{D2}$ settle at the paired transistors 7 and 7*a*. Thus, the control potential P8 corresponds to the potential P6 at the sensor layer 6. If this control potential P8 is connected to the additional electrode 3 and/or the further additional electrode 3*a*, the electric field between the additional electrode 3 and the further additional electrode 3*a*, respectively, and the sensor layer 6 will disappear.

Optionally, this control potential P8 can be provided with an offset ΔU to compensate differences in work function of the conductive layer 6*a* of the reference sensor element 20A and the sensor layer 6 of the fluid sensor element 20.

In the following, the aspects and the functional principle of the fluid sensor 100 will be summarized again.

Similar to an FGFET, the fluid sensor 100 has a floating gate electrode 4 arranged, for example, in a cup-shaped recess 10 or continuous tube-shaped (hollow cylindrical) recess 10.

In the following, a possible configuration or possible materials of the sensor element (cup) 20 will be illustrated exemplarily. The sensor element 20 can comprise, for example, a layer of n silicon, a layer of silicon dioxide into which the floating electrode is embedded and a layer of silicon nitride, e.g., the sensitive layer 6 that also serves for passivation. Inside the opening or recess 10 no electric field, even when the sensitive layer 6 causes equally distributed surface charges. Thereby, interferences of the charge carriers can almost no longer be drawn into the cup, but the substance to be detected (the fluid F) still enters as desired. By the sensitive layer 6 within the recess, a dipole layer is formed at the interface to the isolator, i.e., the further isolation layer arrangement 5, but the changes of potential are read out via the floating gate electrode 4. However, correct detection is only possible when the charge of the floating electrode 4 remains constant. Thus, this floating electrode 4 is directly connected to the gate (control terminal) of an MOSFET 7. By applying a suitable voltage to the cup (or the substrate electrode), the desired operating range of the MOSFET 7 can be adjusted. When the charge at the sensitive layer 6 changes due to a substance to be detected, this results in a change of the drain current of the transistor 7. By the fluid sensor 7, the readout method of the floating electrode 4 can be configured in a very variable manner and the same does not terminate above the gate but is lead out of the cup as separate terminal and is connected to an MOSFET, operational amplifier, inverter or the same. By the open access to the inside of the cup, basically, any sensitive coating is possible in production.

In the following, aspects of the fluid sensor 100 as described based on FIGS. 1 to 3 will be summarized again.

In this context, it should be noted that the additional electrode 3 illustrated in FIG. 1 is merely to be considered as optional element for the subsequently described embodiment of the fluid sensor 100, i.e., the subsequently described fluid sensor 100 can also be implemented without additional electrode 3.

According to an embodiment, the fluid sensor 100 comprises a fluid sensor element 20 with a substrate 1 comprising a recess 10 for receiving a fluid F to be examined, wherein the substrate 1 surrounding the recess 10 is formed, at least in parts, as a substrate electrode 1, and wherein the substrate electrode 1 at least partly surrounds the recess 10 and is connected or connectable to a reference potential or a regulation potential P9, a sensor layer 6 adjacent to a floating gate electrode 4 of a transistor 7, e.g., an FET, in the recess 10, an isolation layer arrangement 2 between the floating gate electrode 4 and the substrate electrode 1, wherein the sensor layer 6, the floating gate electrode 4 and the substrate electrode 1 are arranged such that a first capacitance $C_{41}$ is formed between the substrate electrode 1 and the floating gate electrode 4 and further a second capacitance $C_{46}$ is formed between the floating gate electrode 4 and the sensor layer 6, wherein the first capacitance $C_{41}$ and the second capacitance $C_{46}$ form the capacitance ratio $K=C_{41}/C_{46}$.

Further, the fluid sensor 100 includes processing means 8 configured to hold the transistor 7 at an operating point and to set the regulation potential P9 at the substrate electrode 1 during operation of the fluid sensor using the capacitance ratio K such that the regulation potential P9 at the substrate electrode 1 is the value of the potential P11 at the sensor layer 6 increased by the capacitance ratio K, with $P_9 = K*P_{11}$.

According to an embodiment, an operating current $I_{DS1}$ and an operating voltage $U_{DS1}$ of the transistor 7 are predetermined at the operating point OP1 of the transistor 7.

According to an embodiment, the regulation potential P9 is proportional to the electric change P11 of the sensor layer 6 in the recess 1 caused by the fluid to be examined, wherein the regulation potential P9 or a signal P9' that is derived therefrom or rendered is the sensor output signal $S_{OUT}$ of the fluid sensor 100.

According to an embodiment, the sensor layer 6, the floating gate electrode 4 and the substrate electrode 1 are arranged to form a capacitance ratio $K = C_{41}/C_{46}$, with $K > 1$ or $K \geq 2$ respectively, $K \geq 5$, $K \geq 8$ or $K \approx 10$.

According to an embodiment, the substrate electrode 1 corresponds to a delimited doping region of the substrate.

According to an optional embodiment, the fluid sensor 100 further comprises an additional electrode 3 at an opening area 10-1 of the recess 10, wherein the additional electrode 3 is arranged electrically isolated from the sensor layer 6, the substrate electrode 1 and the floating gate electrode 4 and is connected or connectable to a control potential P8, wherein the processing means 8 is configured to provide the control potential P8 at the additional electrode 3 such that an electric field E between the additional electrode 3 and the sensor layer 6 is at least reduced or compensated during operation of the fluid sensor 100.

According to an embodiment, the processing means 8 is configured to set the control potential P8 to a current sensor potential P11 at the sensor layer 6, wherein the current sensor potential P11 is effected by the fluid to be examined as electric change at the sensor layer 6.

According to an embodiment, the recess 10 extends at the opening area 10-1 from a first surface area 1-1 of the substrate 1 into the substrate 1.

The additional electrode 3 can be formed, for example, of a conductive material, such as a metal material, or a semiconductor material, such as polysilicon, or can comprise these materials.

According to an embodiment, the additional electrode 3 is arranged at the first surface area 1-1 circumferentially around the opening area 10-1 of the recess 10. The additional electrode 3 is configured, for example, as a disc-shaped outer ring 3-1.

According to an embodiment, the additional electrode 3 comprises an overhang area 3-2 extending from the first surface area 1-1 and the isolation layer arrangement 2, beyond the edge of the recess 10 and into the opening area 10-1 or beyond the opening area 10-1.

According to an embodiment, the overhang area 3-2 of the additional electrode 3 leaves the opening area 10-1 of the recess 10 at least partly free.

According to an embodiment, the additional electrode 3 comprises an extension area 3-3 extending, for example, from the overhang area 3-2 into the recess 10 and being arranged circumferentially at a wall area of the recess 10. The additional electrode 3 is configured, for example, as a disc-shaped outer ring 3-1 with the overhang area 3-2 and the inner ring 3-3, e.g., with an L-shaped cross-section.

According to an embodiment, the additional electrode 3 is arranged adjacent to the opening area 10-1 within the recess 10 and circumferentially at a wall area of the recess 10. The additional electrode 3 is configured, for example, as inner ring 3-3.

According to an embodiment, the recess 10 is configured in the form of a trench, a passage, a cup or a gap in the substrate 1. According to an embodiment, the recess 10 is closed on one side or cup-shaped.

According to an embodiment, the transistor 7 is arranged outside the recess 10.

According to an optional embodiment, the recess 10 is configured as passage or via through the substrate 1 from a first surface area 1-1 on a first side of the substrate 1 to a second surface area 1-2 on a second side of the substrate 1. According to an optional embodiment, the recess 10 is configured to be open on two sides.

According to an optional embodiment, the additional electrode 3 is arranged bordering on the opening area 10-1 of the recess 10 on the first side of the substrate 1 and electrically isolated from the sensor layer 6 and is connected or connectable to a control potential, wherein a further additional electrode 3a is arranged bordering on a further opening area 10-2 of the recess 10 on the second side of the substrate 1 and electrically isolated from the sensor layer 6 and is connected or connectable to the control potential P8.

According to an embodiment, the processing means 8 is further configured to set the control potential P8 during operation such that the electric field between the additional electrode 3 and the sensor layer 6 is at least reduced or compensated and such that an electric field between the further additional electrode 3a and the sensor layer 6 is at least reduced or compensated.

According to an optional embodiment, the recess 10 extends at a further opening area 10-2 from the second surface area 1-2 of the substrate 1 into the substrate 1.

According to an optional embodiment, the further additional electrode 3a is arranged at the second surface area 1-2 of the substrate 1 circumferentially around the further opening area 10-2 of the recess 10 (=disc-shaped outer ring).

According to an optional embodiment, the further additional electrode 3a comprises an overhang area 3a-1 extending from the second surface area 1-2 beyond the edge of the recess 10 and into the further opening area 10-2 or beyond the further opening area 10-2.

According to an optional embodiment, the overhang area 3a-1 of the further additional electrode 3a leaves the further opening area 10-2 of the recess 10 at least partly free.

According to an optional embodiment, the further additional electrode 3a comprises an extension area 3a-2 extending from the overhang area 3a-1 into the recess 10a and being arranged circumferentially at a wall area of the recess 10 (=disc-shaped outer ring and inner ring=L-shaped cross-section).

According to an optional embodiment, the further additional electrode 3a is arranged adjacent to the opening area 10-1 inside the recess 10 and circumferentially at a wall area of the recess 10 (=inner ring).

According to an embodiment, the sensor layer 6, the floating gate electrode 4 and the substrate electrode 1 are arranged such that a first capacitance $C_{41}$ is formed between the substrate electrode 1 and the floating gate electrode 4 and further a second capacitance $C_{46}$ is formed between the floating gate electrode 4 and the sensor layer 6, and wherein the substrate electrode 1 of the fluid sensor element at least partly surrounds the recess 10 and is connected or connectable to a regulation potential P9.

According to an embodiment, the processing means 8 is further configured to hold the transistor 7 at an operating point and to sett the regulation potential P9 at the substrate electrode 1 "during operation" of the fluid sensor using the capacitance ratio $K=C_{41}/C_{46}$ such that the regulation potential P9 at the substrate electrode 1 is the value of the sensor potential P11 at the sensor layer 6 increased by the capacitance ratio K, with $P_9=K*P_{11}$ and wherein the processing means 8 is further configured to determine the control potential P8 for the additional electrode based on the regulation potential P9.

According to an embodiment, the processing means 8 is configured to calculate the control potential P8, e.g., within a tolerance range of 1%, 10%, 50% based on the following formula:

$$P_8 = (P_4 - P_9)\frac{C_{41}}{C_{46}} + P_4 + P_{K-optional}, \text{ with } P_4 = \frac{I_D}{\beta \cdot V_{DS}} + V_T,$$

wherein "$P_{K-optional}$" is an optional correction potential, i.e. for optionally considering, for example, a constant offset quantity not detected by the processing means or regulation circuit 8, wherein the term $$\beta = \mu \cdot \frac{W}{L} \cdot \frac{\varepsilon_{ox}}{d_{ox}}$$

is the transconductance of the transistor 7 and wherein $V_T$ is the threshold voltage of the transistor 7 wherein μ is the mobility of the charge carriers, wherein W is the width and L the length of the transistor channel, wherein $\varepsilon_{ox}$ is the permittivity of the gate oxide of the transistor and wherein $d_{ox}$ is the thickness of the gate oxide of the transistor.

The optional correction potential $P_{K-optional}$ or ΔU can be combined with the control potential P8, for example to consider a constant offset quantity that cannot be detected and considered by the processing means or regulation circuit 8. Such an offset quantity can be generated, for example, by fixed charges at the floating gate electrode 4.

The optional correction potential can be predetermined, for example, depending on the system, e.g., to consider different work functions in using the materials due to different material constants. The additional electrode and its control, e.g., also by means of the optional correction potential, can be used for reducing or compensating interferences and influences by different work functions.

With reference to the embodiment of FIG. 1 with the basic equivalent diagram of a fluid sensor 100 with an additional electrode 3 it becomes clear that the processing means 8 according to an embodiment can further be configured to determine the control potential P8 based on the sensor potential P11 at the sensor layer 6 and to determine the sensor potential P11 at the sensor layer 6 in the recess 10 based on a reference sensor element 20A.

According to an embodiment, the reference sensor element 20A comprises: a further substrate 1a comprising a recess 10a for receiving a fluid F to be examined, wherein the substrate 1A surrounding the recess 10a is formed, at least in parts, as further substrate electrode 1a, a conductive sensor substitute layer 6a adjacent to a floating gate electrode 4a of a further transistor 7a (FET) and an isolation layer arrangement 2a between the floating gate electrode 4a of the further transistor 7a and the further substrate electrode 1a, wherein the fluid sensor element 6 and the reference sensor element 6a comprising the conductive sensor substitute layer 6a instead of the sensor layer 6 of the fluid sensor element 20 otherwise have the same structure.

According to an embodiment, the processing means 8 is further configured to hold the transistor 7 and the further transistor 7a at an equal operating point OP, e.g., OP1 transistor 7=AP2, transistor 7a with $U_{DS1}=U_{DS2}$ and $I_{DS1}=I_{DS2}$, such that the same sensor potential P11 as at the sensor layer 6 of the fluid sensor element 20 settles at the conductive sensor substitute layer 6a of the reference sensor element 20A, and wherein the processing means 8 is further configured to provide the sensor potential P11 applied to the conductive sensor substitute layer or a potential P11' (=P11+$P_{K-optional}$) derived therefrom or with an offset ΔU as the control potential P8 for the additional electrode 3.

According to an embodiment, the processing means 8 is further configured to provide the control potential P8 for the additional electrode 3 with an optional correction potential $P_{K-optional}$, i.e., for optionally considering, e.g., a constant offset quantity that is not detected by the processing means or regulation circuit 8.

Further, in the following, aspects of the fluid sensor 100 as the same has been illustrated based on FIGS. 4a-7 will again be illustrated exemplarily. The embodiments show a fluid sensor 100 comprising an additional electrode 3.

The fluid sensor 100 comprises a fluid sensor element 20 with a substrate 1 comprising a recess 10 for receiving a fluid to be examined, wherein the substrate 1 surrounding the recess 10 is formed, at least in parts, as a substrate electrode 1, with a sensor layer 6 in the recess 10 and adjacent to a floating gate electrode 4 of a transistor 7, e.g. an FET, with an isolation layer arrangement 2 between the floating gate electrode 4 and the substrate electrode 1 and with an additional electrode 3 at an opening area 10-1 of the recess 10, wherein the additional electrode 3 is arranged electrically isolated from the sensor layer 6, the substrate electrode 1 and the floating gate electrode 4 and is connected or connectable to a control potential P8.

Further, the fluid sensor 100 comprises processing means 8 that is configured to provide the control potential P8 at the additional electrode 3 such that an electric field between the additional electrode 3 and the sensor layer 6 is at least reduced or compensated during operation of the fluid sensor 100.

Dotted double arrows originating from the processing means 8 to further elements of the fluid sensor 100 indicate that the processing means 8 is connected to the respective element to detect a signal and/or a characteristic of the respective element and/or to further provide a signal, e.g., a control and/or regulation signal to the respective element or to supply or control the respective element with a signal.

According to an embodiment, the processing means 8 is configured to set the control potential P8 to a current sensor potential P11 at the sensor layer 6, wherein the current sensor potential P11 is effected as an electric change at the sensor layer 6 by the fluid to be examined.

According to an embodiment, the recess 10 extends at the opening area 10-1 from a first surface area 1-1 of the substrate 1 into the substrate 1.

The additional electrode 3 can be formed, for example, of a conductive material, such as a metal material or a semiconductor material, such as polysilicon, or can comprise these materials.

According to an embodiment, the additional electrode 3 is arranged at the first surface area 1-1 of the substrate 1 circumferentially around the opening area 10-1 of the recess 10. The additional electrode 3 is configured, for example, as a disc-shaped outer ring 3-1.

According to an embodiment, the additional electrode 3 comprises an overhang area 3-2 extending from the first surface area 1-1 and the isolation layer arrangement 2 beyond the edge of the recess 10 and into the opening area 10-1 or beyond the opening area 10-1.

According to an embodiment, the overhang area 3-2 of the additional electrode 3 leaves the opening area 10-1 of the recess 10 at least partly free.

According to an embodiment, the additional electrode 3 comprises an extension area 3-3 extending, for example, from the overhang area 3-2 into the recess 10 and being arranged circumferentially at a wall area of the recess 10. The additional electrode 3 is configured, for example, as disc-shaped outer ring 3-1 with the overhang area 3-2 and the inner ring 3-3, e.g., with an L-shaped cross-section.

According to an embodiment, the additional electrode 3 is arranged adjacent to the opening area 10-1 within the recess 10 and circumferentially at a wall area of the recess 10. The additional electrode 3 is configured, for example, as inner ring 3-3.

According to an embodiment, the recess 10 is configured in the form of a trench, a passage, a cup or a gap in the substrate 1. According to an embodiment, the recess 10 is closed on one side or cup-shaped.

According to an embodiment, the transistor 7 is arranged outside the recess 10.

According to an optional embodiment, the recess 10 is configured as passage or via through the substrate 1 from a first surface area 1-1 on a first side of the substrate 1 to a second surface area 1-2 on a second side of the substrate 1. According to an optional embodiment, the recess 10 is configured to be open on two sides.

According to an optional embodiment, the additional electrode 3 is arranged bordering on the opening area 10-1 of the recess 10 on the first side of the substrate 1 and electrically isolated from the sensor layer 6 and is connected or connectable to a control potential, wherein a further additional electrode 3a is arranged bordering on a further opening area 10-2 of the recess 10 on the second side of the substrate 1 and electrically isolated from the sensor layer 6 and is connected or connectable to the control potential P8.

According to an embodiment, the processing means 8 is further configured to set the control potential P8 during operation such that the electric field between the additional electrode 3 and the sensor layer 6 is at least reduced or compensated and that an electric field between the further additional electrode 3a and the sensor layer 6 is at least reduced or compensated.

According to an optional embodiment, the recess 10 extends at a further opening area 10-2 from the second surface area 1-2 of the substrate 1 into the substrate 1.

According to an optional embodiment, the further additional electrode 3a is arranged at the second surface area 1-2 of the substrate 1 circumferentially around the further opening area 10-2 of the recess 10 (=disc-shaped outer ring).

According to an optional embodiment, the further additional electrode 3a comprises an overhang area 3a-1 extending from the second surface area 1-2 beyond the edge of the recess 10 and into the further opening area 10-2 or beyond the further opening area 10-2.

According to an optional embodiment, the overhang area 3a-1 of the further additional electrode 3a leaves the further opening area 10-2 of the recess 10 at least partly free.

According to an optional embodiment, the further additional electrode 3a comprises an extension area 3a-2 extending from the overhang area 3a-1 into the recess 10a or being arranged circumferentially at a wall area of the recess 10 (=disc-shaped outer ring and inner ring=L-shaped cross-section).

According to an optional embodiment, the further additional electrode 3a is arranged adjacent to the opening area 10-1 within the recess 10 and circumferentially at a wall area of the recess 10 (=inner ring).

According to an embodiment, the sensor layer 6, the floating gate electrode 4 and the substrate electrode 1 are arranged such that a first capacitance $C_{41}$ is formed between the substrate electrode 1 and the floating gate electrode 4 and further a second capacitance $C_{46}$ is formed between the floating gate electrode 4 and the sensor layer 6, and wherein the substrate electrode 1 of the fluid sensor element at least partly surrounds the recess 10 and is connected or connectable to a regulation potential P9.

According to an embodiment, the processing means 8 is further configured to hold the transistor 7 at an operating point and to set the regulation potential P9 at the substrate electrode 1 "during operation" of the fluid sensor using the capacitance ratio $K=C_{41}/C_{46}$ such that the regulation potential P9 at the substrate electrode 1 is the value of the sensor potential P11 at the sensor layer 6 increased by the capacitance ratio K, with $P_9=K*P_{11}$, and wherein the processing means 8 is further configured to determine the control potential P8 for the additional electrode based on the regulation potential P9.

According to an embodiment, the processing means 8 is configured to calculate the control potential P8, e.g., within a tolerance range of 1%, 10%, 50% based on the following formula:

$$P_8 = (P_4 - P_9)\frac{C_{41}}{C_{46}} + P_4 + P_{K-optional}, \text{ with } P_4 = \frac{I_D}{\beta \cdot V_{DS}} + V_T,$$

wherein "$P_{K-optional}$" is an optional correction potential, i.e. for optionally considering, for example, a constant offset quantity not detected by the processing means or regulation circuit 8, wherein the term $$\beta = \mu \cdot \frac{W}{L} \cdot \frac{\varepsilon_{ox}}{d_{ox}}$$

is the transconductance of the transistor 7 and wherein $V_T$ is the threshold voltage of the transistor 7 wherein μ is the mobility of the charge carriers, wherein W is the width and L the length of the transistor channel, wherein $\varepsilon_{ox}$ is the permittivity of the gate oxide of the transistor and wherein $d_{ox}$ is the thickness of the gate oxide of the transistor.

The optional correction potential $P_{K-optional}$ or ΔU can be combined with the control potential P8, for example to consider a constant offset quantity that cannot be detected and considered by the processing means or regulation circuit 8. Such an offset quantity can be generated, for example, by fixed charges at the floating gate electrode 4.

The optional correction potential can be predetermined, for example, depending on the system, e.g., to consider different work functions in using the materials due to different material constants. The additional electrode and its control, e.g., also by means of the optional correction potential, can be used for reducing or compensating interferences and influences by different work functions.

The embodiment of FIG. 6 shows a basic equivalent circuit diagram of a fluid sensor 100 with an additional electrode 3, wherein the processing means 8 according to an embodiment is further configured to determine the control potential P8 based on the sensor potential P11 at the sensor layer 6 and to determine the sensor potential P11 at the sensor layer 6 in the recess 10 based on a reference sensor element 20A.

According to an embodiment, the reference sensor element 20A comprises: A further substrate 1 a comprising a recess 10a for receiving a fluid F to be examined, wherein the substrate 1 a surrounding the recess 10a is formed, at least in parts, as a further substrate electrode 1 a, a conductive sensor substitute layer 6a adjacent to a floating gate electrode 4a of a further transistor 7a (FET) and an isolation layer arrangement 2a between the floating gate electrode 4a of the further transistor 7a and the further substrate electrode 1a, wherein the fluid sensor element 6 and the reference sensor element 6a comprising a conductive sensor substitute layer 6a instead of the sensor layer 6 of the fluid sensor element 20 otherwise have the same structure.

According to an embodiment, the processing means 8 is further configured to hold the transistor 7 and the further transistor 7a at an equal operating point OP, e.g., OP1 of transistor 7=OP of Transistor 7a with $U_{DS1}=U_{DS2}$ and $I_{DS1}=I_{DS2}$, such that the same sensor potential P11 as at the sensor layer 6 of the fluid sensor element 20 settles at the conductive sensor substitute layer 6a of the reference sensor element 20A, and wherein the processing means 8 is further configured to provide the sensor potential P11 applied to the conductive sensor substitute layer or a potential P11' (=P11+$P_{K\text{-}optional}$ or with an offset $\Delta U$) derived therefrom as the control potential P8 for the additional electrode 3.

According to an embodiment, the processing means 8 is further configured to provide the control potential P8 for the additional electrode 3 with an optional correction potential $P_{K\text{-}optional}$, i.e., for optional consideration of, for example, a constant offset quantity that is not detected by the processing means or regulation circuit 8.

Thus, the processing means 8 can be configured to obtain a temperature-stable operating point or temperature-stable operating points OP1, OP2 in order to hold, for example, the potential P4 at the floating gate electrode 4 at an essentially equal or constant value. Thereby, a reverse influence on the sensor potential P11 at the sensor layer 6 is prevented.

According to an embodiment, the regulation potential P9 is proportional to the electric change P11 of the sensor layer 6 in the recess 1 caused by the fluid to be examined, and the regulation potential P9 or a signal that is derived therefrom or rendered is the sensor output signal $S_{OUT}$ of the fluid sensor 100.

If not otherwise defined, all terms used herein (including technical and scientific term) have the same meaning as normally understood by a person skilled in the art of the embodiments. Further, it is obvious that terms that are defined in commonly used dictionaries should be interpreted as having a meaning corresponding to its meaning in the context of the respective technology. However, if the present disclosure gives a specific meaning to a term that deviates from the meaning as commonly understood by a person skilled in the art, this meaning has to be considered in the specific context where this definition is given.

While embodiments are suitable for different modifications and alternative forms, accordingly, embodiments of the same are exemplarily shown in the figures and described in detail herein. However, it is obvious that it is not intended to limit the embodiment to the disclosed specific forms, in contrary, the embodiments are to cover all modifications, correspondences and alternatives falling within the frame of the disclosure. In the entire description of the figures, the same reference numbers relate to the same or similar elements.

Although some aspects have been described in the context of an apparatus, it is obvious that these aspects also represent a description of the corresponding method, such that a block or device of an apparatus also corresponds to a respective method step or a feature of a method step. Analogously, aspects described in the context of a method step also represent a description of a corresponding block or detail or feature of a corresponding apparatus.

In the above detailed description, partly, different features have been grouped together in examples to streamline the disclosure. This type of disclosure is not to be interpreted as an intention that the claimed example comprise more features than explicitly stated in each claim. Rather, as stated by the following claims, the subject matter can consist of less than in all features of an individual disclosed example. Consequently, the following claims are incorporated in the detailed description, wherein each claim can stand on its own as a separate example. While each claim can stand on its own as a separate example, it should be noted that despite the fact that dependent claims in the claims relate to a specific combination with one or several other claims, other examples can also include a combination of dependent claims with the subject matter of the respective other dependent claim or a combination of each feature with other dependent or independent claims. Such combinations are incorporated unless it is stated that a specific combination is not intended. Further, it is intended that a combination of features of a claim with every other independent claim is incorporated, even when this claim is not directly dependent on the independent claim.

Some or all of the method steps may be performed by a hardware apparatus (or using a hardware apparatus), such as a microprocessor, a programmable computer or an electronic circuit. In some embodiments, some or several of the most important method steps may be performed by such an apparatus.

The description and drawings only illustrate the principles of the disclosure. It is obvious that the person skilled in the art can derive different arrangements that still embody the principles of the disclosure and are included in its scope and essence although the same are not explicitly described or illustrated. Further, all examples stated herein are basically only for teaching purposes in order to support the reader in the understanding of the principles of the disclosure and the concepts for developing the technology further provided by the inventor(s) and are not intended to limit such specifically stated examples and conditions. Further, all statements on principles, aspects and embodiments of the disclosure as well as specific examples of the same are to include their equivalents.

The person skilled in the art should understand that all block diagrams herein illustrate conceptual views of exemplary circuits that embody the principles of the disclosure. In a similar manner, it is obvious that all flow diagrams, process diagrams, state transition diagrams, pseudo code and the same illustrate different processes that are essentially illustrated in a computer readable medium and are executed by a computer or processor irrespective whether such a computer or processor is explicitly illustrated.

Further, the subsequent claims are incorporated in the detailed description, where each claim can stand on its own as a separate embodiment. When each claim can stand on its own as a separate embodiment, it has to be considered that although a dependent claim in the claims can relate to a specific combination with one or several other claims, other embodiments can also include a combination of the dependent claim with the subject matter of each other dependent or independent claim. These combinations are suggested herein if it is not indicated that a specific combination is not intended. Further, features of a claim are also incorporated for each other independent claim even when this claim is not directly dependent on the independent claim.

Further, it should be noted that methods disclosed in the description or in the claims can be implemented by an apparatus having means for performing each of the respective steps of these methods.

Further, it is obvious that the disclosure of multiple steps or functions disclosed in the description or the claims is not to be interpreted as being in a specific order. By disclosing multiple steps or functions, the same are not limited to a specific order unless these steps or functions are not interexchangeable for technical reasons. Further, in some embodiments, an individual step can include several substeps or can be broken up into the same. Such sub-steps can be incorporated and can be part of the disclosure of this individual step as long as the same are not explicitly excluded.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A fluid sensor, comprising:
a fluid sensor element, comprising:
a substrate comprising a recess for receiving a fluid to be examined, wherein the substrate surrounding the recess is formed, at least in parts, as a substrate electrode,
an isolation layer arrangement between a floating gate electrode of a transistor and the substrate electrode and
a sensor layer in the recess and adjacent to the floating gate electrode,
an additional electrode at an opening area of the recess, wherein the additional electrode is arranged electrically isolated from the sensor layer, the substrate electrode and the floating gate electrode and is connected or connectable to a control potential and
a processor configured to provide the control potential at the additional electrode such that an electric field between the additional electrode and the sensor layer is at least reduced or compensated during operation of the fluid sensor; and
wherein the processor is configured to set the control potential to a current sensor potential at the sensor layer, wherein the current sensor potential is effected as an electric change at the sensor layer by the fluid to be examined.

2. Fluid sensor according to claim 1, wherein the recess at the opening area extends from a first surface area of the substrate into the substrate.

3. Fluid sensor according to claim 1, wherein the additional electrode is configured adjacent to the opening area of the recess bordering on the top main surface area of the substrate as a disc-shaped outer ring, inside the recess as a circumferential inner ring at the wall area of the recess or as an L-shaped combination of the disc-shaped outer ring and the inner ring.

4. Fluid sensor according to claim 1, wherein the recess is configured in the shape of a trench, a cup or a gap in the substrate, wherein the recess is closed on one side or cup-shaped.

5. Fluid sensor according to claim 1, wherein the recess is configured as passage or via through the substrate from a first surface area on a first side of the substrate to a second surface area on a second side of the substrate, wherein the recess is configured to be open on two sides.

6. Fluid sensor according to claim 5, wherein the additional electrode is arranged bordering on the opening area of the recess on the first side of the substrate and electrically isolated from the sensor layer and is connected or connectable to a control potential and
wherein a further additional electrode is arranged bordering on a further opening area of the recess on the second side of the substrate and electrically isolated from the sensor layer and is connected or connectable to the control potential.

7. Fluid sensor according to claim 6, wherein the processor is further configured to set the control potential during operation
such that the electric field between the additional electrode and the sensor layer is at least reduced or compensated and
such that an electric field between the further additional electrode and the sensor layer is at least reduced or compensated.

8. Fluid sensor according to claim 6, wherein the further additional electrode is configured adjacent to a further opening area of the recess bordering on the bottom main surface area of the substrate as a disc-shaped outer ring, inside the recess as a circumferential inner ring at the wall area of the recess or as an L-shaped combination of the disc-shaped outer ring and the inner ring.

9. Fluid sensor according to claim 1, wherein the sensor layer, the floating gate electrode and the substrate electrode are arranged such that a first capacitance $C_{41}$ is formed between the substrate electrode and the floating gate electrode, and further a second capacitance $C_{46}$ is formed between the floating gate electrode and the sensor layer, and wherein the substrate electrode of the fluid sensor element at least partly surrounds the recess and is connected or connectable to a regulation potential.

10. Fluid sensor according to claim 9, wherein the processor is further configured to hold the transistor at an operating point and to set the regulation potential at the substrate electrode "during operation" of the fluid sensor using the capacitance ratio $K=C_{41}/C_{46}$ such that the regulation potential at the substrate electrode is the value of the sensor potential at the sensor layer increased by the capacitance ratio K, with $P_9=K*P_{11}$, and
wherein the processor is further configured to determine the control potential for the additional electrode and/or the further additional electrode based on the regulation potential.

11. Fluid sensor according to claim 9, wherein the processor is configured to calculate the control potential based on the following formula:

$$P_8 = (P_4 - P_9)\frac{C_{41}}{C_{46}} + P_4 + P_{K-optional}, \text{ with } P_4 = \frac{I_D}{\beta \cdot V_{DS}} + V_T,$$

wherein $P_{K-optional}$ is an optional correction potential, wherein the term $$\beta = \mu \cdot \frac{W}{L} \cdot \frac{\varepsilon_{ox}}{d_{ox}}$$

is the transconductance of the transistor and
wherein $V_T$ is the threshold voltage of the transistor,
wherein $\mu$ is the mobility of the charge carriers,
wherein W is the width and L the length of the transistor channel,
wherein $\varepsilon_{ox}$ is the permittivity of the gate oxide of the transistor and
wherein $d_{ox}$ is the thickness of the gate oxide of the transistor.

12. Fluid sensor according to claim 1, wherein the processor is configured to determine the control potential based on the sensor potential at the sensor layer and to determine the sensor potential at the sensor layer in the recess based on a reference sensor element.

13. Fluid sensor according to claim 12, wherein the reference sensor element comprises:
a further substrate area comprising a recess for receiving a fluid to be examined, wherein the substrate surrounding the recess is formed, at least in parts, as a further substrate electrode,
an isolation layer arrangement between a floating gate electrode of a further transistor and the further substrate electrode; and
a conductive sensor substitute layer adjacent to the floating gate electrode of the further transistor,
wherein the fluid sensor element and the reference sensor element comprising the conductive sensor substitute layer instead of the sensor layer of the fluid sensor element otherwise have the same structure.

14. Fluid sensor according to claim 13, wherein the processor is further configured to hold the transistor and the further transistor at the same operating point such that the same sensor potential as at the sensor layer of the fluid sensor element settles at the conductive sensor substitute layer of the reference sensor element and
wherein the processor is further configured to provide the sensor potential applied to the conductive sensor substitute layer or a potential derived therefrom as the control potential for the additional electrode.

15. Fluid sensor according to claim 14, wherein the processor is further configured to provide the control potential for the additional electrode with an optional correction potential $P_{K-optional}$.

16. Fluid sensor according to claim 13, wherein the regulation potential is proportional to the electric change of the sensor layer in the recess caused by the fluid to be examined, and wherein the regulation potential or a signal that is derived therefrom or rendered is the sensor output signal of the fluid sensor.

17. Fluid sensor, comprising:
a fluid sensor element comprising:
a substrate comprising a recess for receiving a fluid to be examined, wherein the substrate surrounding the recess is formed, at least in parts, as a substrate electrode, and wherein the substrate electrode at least partly surrounds the recess and is connected or connectable to a reference potential or regulation potential,
an isolation layer arrangement between a floating gate electrode of a transistor and the substrate electrode,
a sensor layer adjacent to the floating gate electrode in the recess,
wherein the sensor layer, the floating gate electrode and the substrate electrode are arranged such that a first capacitance $C_{41}$ is formed between the substrate electrode and the floating gate electrode, and further a second capacitance $C_{46}$ is formed between the floating gate electrode and the sensor layer, wherein the first capacitance $C_{41}$ and the second capacitance $C_{46}$ form a capacitance ratio $K=C_{41}/C_{46}$ and
a processor configured to hold the transistor at an operating point and to set the regulation potential at the substrate electrode during operation of the fluid sensor using the capacitance ratio K, such that the regulation potential at the substrate electrode is the value of the potential at the sensor layer increased by the capacitance ratio K, with $P_9=K*P_{11}$.

18. Fluid sensor according to claim 17, wherein the regulation potential is proportional to the electric change of the sensor layer in the recess caused by the fluid to be examined, and wherein the regulation potential or a signal that is derived therefrom or rendered is the sensor output signal of the fluid sensor.

19. Fluid sensor according to claim 17, wherein the sensor layer, the floating gate electrode and the substrate electrode are arranged to form a capacitance ratio $K=C_{41}/C_{46}$, with $K \geq 2$, 5 or 8.

20. Fluid sensor according to claim 17, wherein the substrate electrode corresponds to a delimited doping region of the substrate.

21. Fluid sensor according to claim 17, wherein the sensor element further comprises:
an additional electrode at an opening area of the recess, wherein the additional electrode is arranged electrically isolated from the sensor layer, the substrate electrode and the floating gate electrode and is connected or connectable to a control potential,
wherein the processor is configured to provide the control potential at the additional electrode such that an electric field between the additional electrode and the sensor layer is at least reduced or compensated during operation of the fluid sensor.

22. Fluid sensor according to claim 21, wherein the processor is configured to set the control potential to a current sensor potential at the sensor layer, wherein the current sensor potential is effected as an electric change at the sensor layer by the fluid to be examined.

23. Fluid sensor according to claim 17, wherein the additional electrode is configured adjacent to the opening area of the recess bordering on the top main surface area of the substrate as a disc-shaped outer ring, inside the recess as a circumferential inner ring at the wall area of the recess or as an L-shaped combination of the disc-shaped outer ring and the inner ring.

24. Fluid sensor according to claim 17, wherein the recess is configured in the form of a trench, a cup or a gap in the substrate, wherein the recess is closed on one side or cup-shaped.

25. Fluid sensor according to claim 17, wherein the recess is configured as passage or via through the substrate from a first surface area on a first side of the substrate to a second surface area on a second side of the substrate, wherein the recess is configured to be open on two sides.

26. Fluid sensor according to claim 25, wherein the additional electrode is arranged bordering on the opening area of the recess on the first side of the substrate and electrically isolated from the sensor layer and is connected or connectable to a control potential and
wherein a further additional electrode is arranged bordering on a further opening area of the recess on the second side of the substrate and electrically isolated from the sensor layer and is connected or connectable to the control potential.

27. Fluid sensor according to claim 26, wherein the processor is further configured to set the control potential during operation,
such that the electric field between the additional electrode and the sensor layer is at least reduced or compensated and
such that an electric field between the further additional electrode and the sensor layer is at least reduced or compensated.

28. Fluid sensor according to claim 26, wherein the further additional electrode is configured adjacent to a further opening area of the recess bordering on the bottom main surface area of the substrate as a disc-shaped outer ring, inside the recess as a circumferential inner ring at the wall area of the recess or as an L-shaped combination of the disc-shaped outer ring and the inner ring.

29. Fluid sensor according to claim 21, wherein the sensor layer, the floating gate electrode and the substrate electrode are arranged such that a first capacitance $C_{41}$ is formed between the substrate electrode and the floating gate electrode and further a second capacitance $C_{46}$ is formed between the floating gate electrode and the sensor layer, and wherein the substrate electrode of the fluid sensor element at least partly surrounds the recess and is connected or connectable to a regulation potential, and
wherein the processor is further configured to hold the transistor at an operating point and to set the regulation potential at the substrate electrode "during operation" of the fluid sensor using the capacitance ratio $K=C_{41}/C_{46}$, such that the regulation potential at the substrate electrode is the value of the sensor potential at the sensor layer increased by the capacitance ratio K, with $P_9=K*P_{11}$.

30. Fluid sensor according to claim 21, wherein the processor is further configured to determine the control potential for the additional electrode based on the regulation potential.

31. Fluid sensor according to claim 26, wherein the processor is further configured to determine the control potential for the further additional electrode based on the regulation potential.

32. Fluid sensor according to claim 30, wherein the processor is configured to calculate the control potential based on the following formula:

$$P_8 = (P_4 - P_9)\frac{C_{41}}{C_{46}} + P_4 + P_{K-optional}, \text{ with } P_4 = \frac{I_D}{\beta \cdot V_{DS}} + V_T,$$

wherein $P_{K-optional}$ is an optional correction potential, wherein the term $$\beta = \mu \cdot \frac{W}{L} \cdot \frac{\varepsilon_{ox}}{d_{ox}}$$

is the transconductance of the transistor and
wherein $V_T$ is the threshold voltage of the transistor,
wherein $\mu$ is the mobility of the charge carriers,
wherein W is the width and L the length of the transistor channel,
wherein $\varepsilon_{ox}$ is the permittivity of the gate oxide of the transistor and
wherein $d_{ox}$ is the thickness of the gate oxide of the transistor.

33. Fluid sensor according to claim 18, wherein the processor is configured to determine the control potential based on the sensor potential at the sensor layer and to determine the sensor potential at the sensor layer in the recess based on a reference sensor element.

34. Fluid sensor according to claim 33, wherein the reference sensor element comprises:
a further substrate comprising a recess for receiving a fluid to be examined, wherein the substrate surrounding the recess is formed, at least in parts, as a further substrate electrode,
an isolation layer arrangement between a floating gate electrode of a further transistor and the further substrate electrode; and
a conductive sensor substitute layer adjacent to the floating gate electrode,
wherein the fluid sensor element and the reference sensor element comprising the conductive sensor substitute layer instead of the sensor layer of the fluid sensor element otherwise have the same structure.

35. Fluid sensor according to claim 34, wherein the processor is further configured to hold the transistor and the further transistor at the same operating point, such that the same sensor potential as at the sensor layer of the fluid sensor element settles at the conductive sensor substitute layer of the reference sensor element and
wherein the processor is further configured to provide the sensor potential applied to the conductive sensor substitute layer or a potential derived therefrom as the control potential for the additional electrode.

36. Fluid sensor according to claim 35, wherein the processor is further configured to provide the control potential for the additional electrode with an optional correction potential $P_{K-optional}$.

37. Fluid sensor according to claim 34, wherein the regulation potential is proportional to the electric change of the sensor layer in the recess caused by the fluid to be examined, and wherein the regulation potential or a signal that is derived therefrom or rendered is the sensor output signal of the fluid sensor.

* * * * *